US011901350B2

(12) United States Patent
Huang

(10) Patent No.: US 11,901,350 B2
(45) Date of Patent: Feb. 13, 2024

(54) METHOD FOR FABRICATING SEMICONDUCTOR DEVICE WITH STACKING STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 220 days.

(21) Appl. No.: 17/563,346

(22) Filed: Dec. 28, 2021

(65) Prior Publication Data

US 2023/0207550 A1 Jun. 29, 2023

(51) Int. Cl.
| H01L 25/00 | (2006.01) |
| H01L 25/065 | (2023.01) |
| H01L 25/10 | (2006.01) |
| H01L 23/00 | (2006.01) |
| H01L 23/498 | (2006.01) |

(52) U.S. Cl.
CPC ........ *H01L 25/50* (2013.01); *H01L 23/49827* (2013.01); *H01L 24/16* (2013.01); *H01L 25/0657* (2013.01); *H01L 25/105* (2013.01); *H01L 2224/16146* (2013.01); *H01L 2225/06513* (2013.01); *H01L 2225/06541* (2013.01); *H01L 2924/15311* (2013.01)

(58) Field of Classification Search
None
See application file for complete search history.

(56) References Cited

U.S. PATENT DOCUMENTS

| 8,930,647 B1 * | 1/2015 | Smith ................. G06F 12/0811 |
| | | 711/E12.008 |
| 10,665,535 B2 * | 5/2020 | Lee ...................... H01L 21/4857 |
| 2013/0083587 A1 * | 4/2013 | Sekar ..................... G11C 5/025 |
| | | 365/182 |
| 2016/0300808 A1 * | 10/2016 | Kuo .................. H01L 23/49811 |
| 2019/0043836 A1 | 2/2019 | Fastow et al. |
| 2021/0305259 A1 | 9/2021 | Cheng et al. |

FOREIGN PATENT DOCUMENTS

| TW | 201423967 A | 6/2014 |
| WO | WO2021068229 A1 | 4/2021 |

* cited by examiner

*Primary Examiner* — Hung K Vu
(74) *Attorney, Agent, or Firm* — MUNCY, GEISSLER, OLDS & LOWE, P.C.

(57) ABSTRACT

The present application discloses a method for fabricating a semiconductor device including providing a first stacking structure comprising a first controller die, and a plurality of first storage dies sequentially stacked on the first controller die; providing a second stacking structure comprising a second controller die, and a plurality of second storage dies sequentially stacked on the second controller die; bonding the first controller die onto a bottom die through a plurality of first interconnect units; and bonding the second controller die onto the bottom die through a plurality of second interconnect units. The plurality of first storage dies respectively comprise a plurality of first storage units configured as a floating array. The plurality of second storage dies comprise a plurality of second storage units respectively comprising an insulator-conductor-insulator structure.

14 Claims, 35 Drawing Sheets

METHOD FOR FABRICATING SEMICONDUCTOR DEVICE WITH STACKING STRUCTURE

TECHNICAL FIELD

The present disclosure relates to a method for fabricating a semiconductor device, and more particularly, to a method for fabricating a semiconductor device with stacking structures.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a bottom die; a first stacking structure comprising a first controller die positioned on the bottom die, and a plurality of first storage dies stacked on the first controller die; and a second stacking structure comprising a second controller die positioned on the bottom die, and a plurality of second storage dies stacked on the second controller die. The plurality of first storage dies respectively comprise a plurality of first storage units configured as a floating array. The plurality of second storage dies comprise a plurality of second storage units respectively comprising an insulator-conductor-insulator structure.

Another aspect of the present disclosure provides a semiconductor device including a bottom die; a first stacking structure positioned on the bottom die through a plurality of first interconnect units; and a second stacking structure positioned on the bottom die through a plurality of second interconnect units. The first stacking structure comprises a first controller die positioned on the plurality of first interconnect units, and a plurality of first storage dies stacked on the first controller die and configured as a floating array. The second stacking structure comprises a second controller die positioned on the plurality of second interconnect units, and a plurality of second storage dies stacked on the second controller die and respectively comprising an insulator-conductor-insulator structure.

Another aspect of the present disclosure provides a method for fabricating a semiconductor device including providing a first stacking structure comprising a first controller die, and a plurality of first storage dies sequentially stacked on the first controller die; providing a second stacking structure comprising a second controller die, and a plurality of second storage dies sequentially stacked on the second controller die; bonding the first controller die onto a bottom die through a plurality of first interconnect units; and bonding the second controller die onto the bottom die through a plurality of second interconnect units. The plurality of first storage dies respectively comprise a plurality of first storage units configured as a floating array. The plurality of second storage dies comprise a plurality of second storage units respectively comprising an insulator-conductor-insulator structure.

Due to the design of the semiconductor device of the present disclosure, the first stacking structure including the first storage units in the form of floating array and the second stacking structure including the second storage units including the insulator-conductor-insulator structures may be integrated with the bottom die. Hence, the dimension of the semiconductor device may be reduced. In addition, the through substrate vias may also reduce electrical paths within the first stacking structure and/or the second stacking structure so that the power consumption may be reduced. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
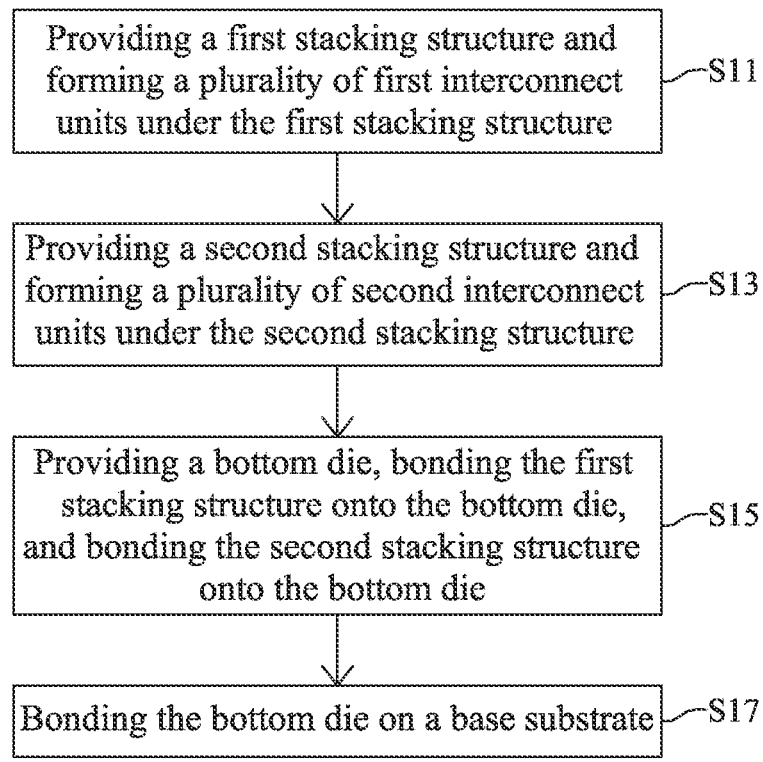
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 25:
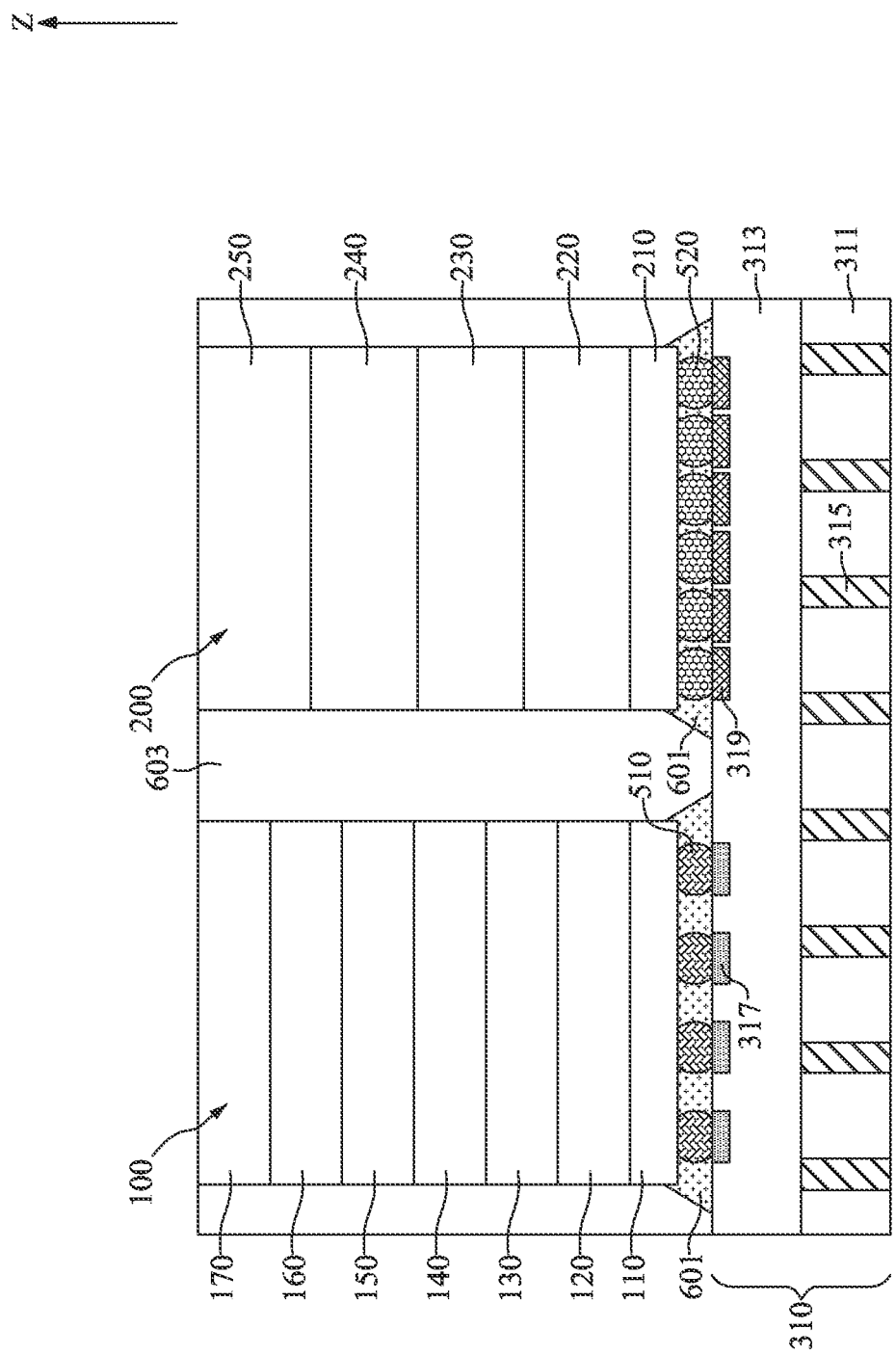
FIGS. 25 and 26 illustrate, in schematic cross-sectional view diagrams, part of the flow for fabricating the semiconductor device in accordance with one embodiment of the present disclosure.
Figure 26:
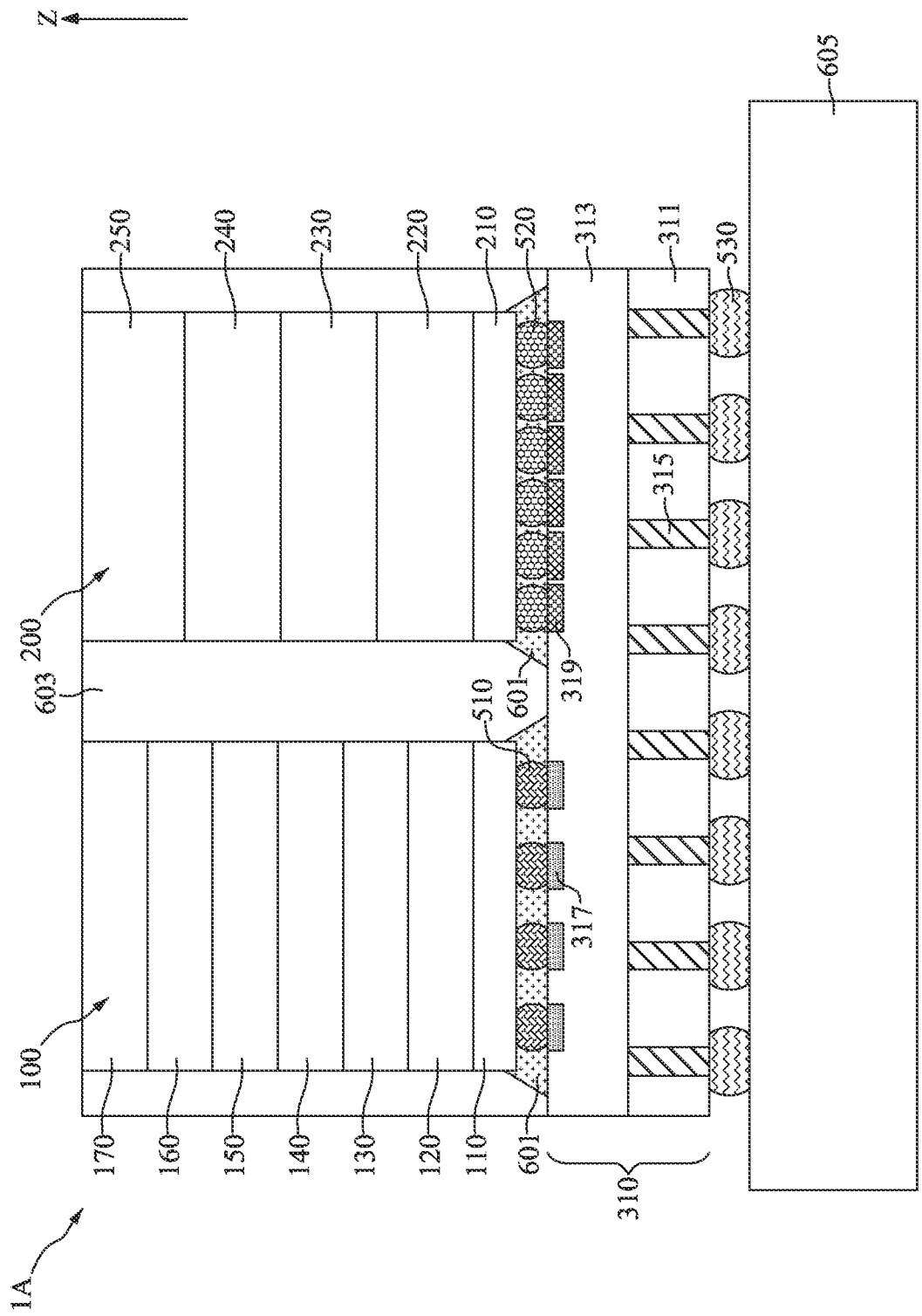

FIG. 1 illustrates, in a flowchart diagram form, a method 10 for fabricating a semiconductor device 1A in accordance with one embodiment of the present disclosure. FIGS. 2 to 20 illustrate, in schematic cross-sectional view diagrams, part of a flow for fabricating the semiconductor device 1A in accordance with one embodiment of the present disclosure. FIGS. 23 and 24 are close-up schematic cross-sectional view diagrams of areas A1 and A2 in FIG. 22. FIGS. 25 and 26 illustrate, in schematic cross-sectional view diagrams, part of the flow for fabricating the semiconductor device 1A in accordance with one embodiment of the present disclosure.

With reference to FIGS. 1 to 10, at step S11, a first stacking structure 100 may be provided and a plurality of first interconnect units 510 may be formed under the first stacking structure 100.

Figure 2:
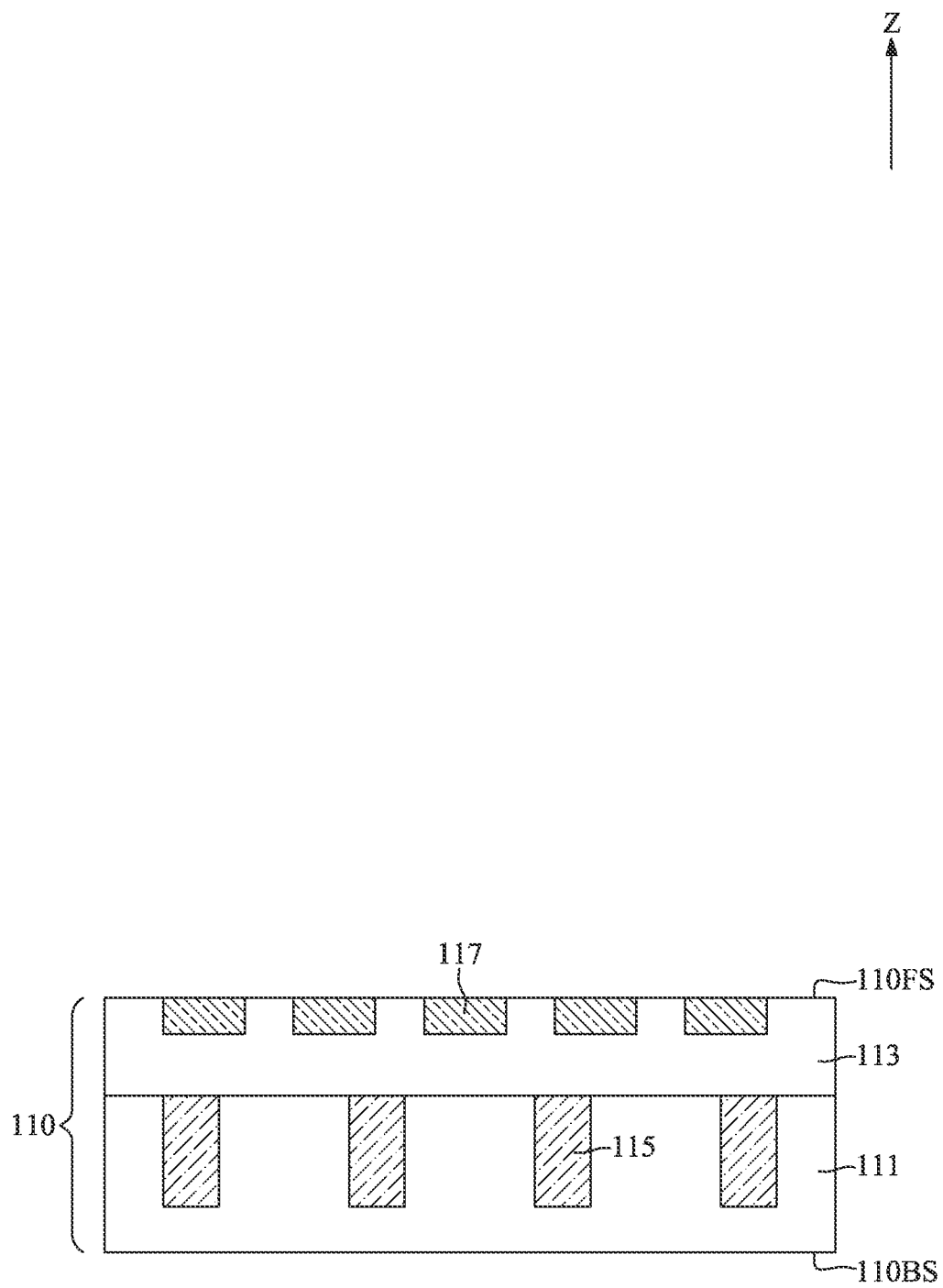
FIGS. 2 to 20 illustrate, in schematic cross-sectional view diagrams, part of a flow for fabricating the semiconductor device in accordance with one embodiment of the present disclosure.

With reference to FIG. 2, a first controller die 110 may be provided. The first controller die 110 may include a substrate 111, a plurality of through substrate vias 115, a plurality of device elements (not shown for clarity), a plurality of conductive features including conductive pads 117, and a dielectric layer 113.

In some embodiments, the substrate 111 of the first controller die 110 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the through substrate vias 115 of the first controller die 110 may be formed in the substrate 111. The top surfaces of the through substrate vias 115 may be substantially coplanar with the top surface of the substrate 111. In some embodiments, the through substrate vias 115 may be formed by a via-first process. In some embodiments, the through substrate vias 115 may be formed by a via-middle process or a via-last process.

In some embodiments, the plurality of device elements of the first controller die 110 may be formed on the substrate 111. The device elements may be transistors such as complementary metal-oxide-semiconductor transistors, metal-oxide-semiconductor field-effect transistors, fin field-effect-transistors, the like, or a combination thereof.

In some embodiments, the dielectric layer 113 may be formed on the substrate 111. The dielectric layer 113 may be a stacked layer structure. The dielectric layer 113 may include a plurality of insulating sub-layers. Each of the insulating sub-layers may have a thickness between about 0.5 µm and about 3.0 µm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The low-k dielectric materials may have a dielectric constant less than 3.0 or even less than 2.5. In some embodiments, the low-k dielectric materials may have a dielectric constant less than 2.0. The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the conductive features of the first controller die 110 may be formed in the dielectric layer 113. The conductive features may include conductive lines (not shown), conductive vias (not shown), and the conductive pads 117. The conductive lines may be separated from each other and may be horizontally disposed in the dielectric layer 113 along the direction Z. In the present embodiment, the topmost conductive lines may be designated as the conductive pads 117. The top surfaces of the conductive pads 117 and the top surface of the dielectric layer 113 may be substantially coplanar. The conductive vias may connect adjacent conductive features.

In some embodiments, the conductive features of the first controller die 110 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The conductive features may be formed during the formation of the dielectric layer 113.

In some embodiments, the device elements and the conductive features of the first controller die 110 may together configure functional units of the first controller die 110. A functional unit, in the description of the present disclosure, generally refers to functionally related circuitry that has been partitioned for functional purposes into a distinct unit. In some embodiments, the functional units of the first controller die 110 may include, for example, highly complex circuits such as memory controllers or accelerator units. In some embodiments, the functional units of the first controller die 110 may include control circuit and high-speed circuitry that are associated with a memory die. In some embodiments, the first controller die 110 may be configured as a controller of a memory die.

It should be noted that, in the description of the present disclosure, the term "front" surface is a term of art implying the major surface of the structure upon which is formed device elements and conductive features. Likewise, the "back" surface of a structure is that major surface opposite to the front surface. For example, the top surface of the dielectric layer 113 may be referred to as the front surface 110FS of the first controller die 110. The bottom surface of the substrate 111 may be referred to as the back surface 110BS of the first controller die 110.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 3:
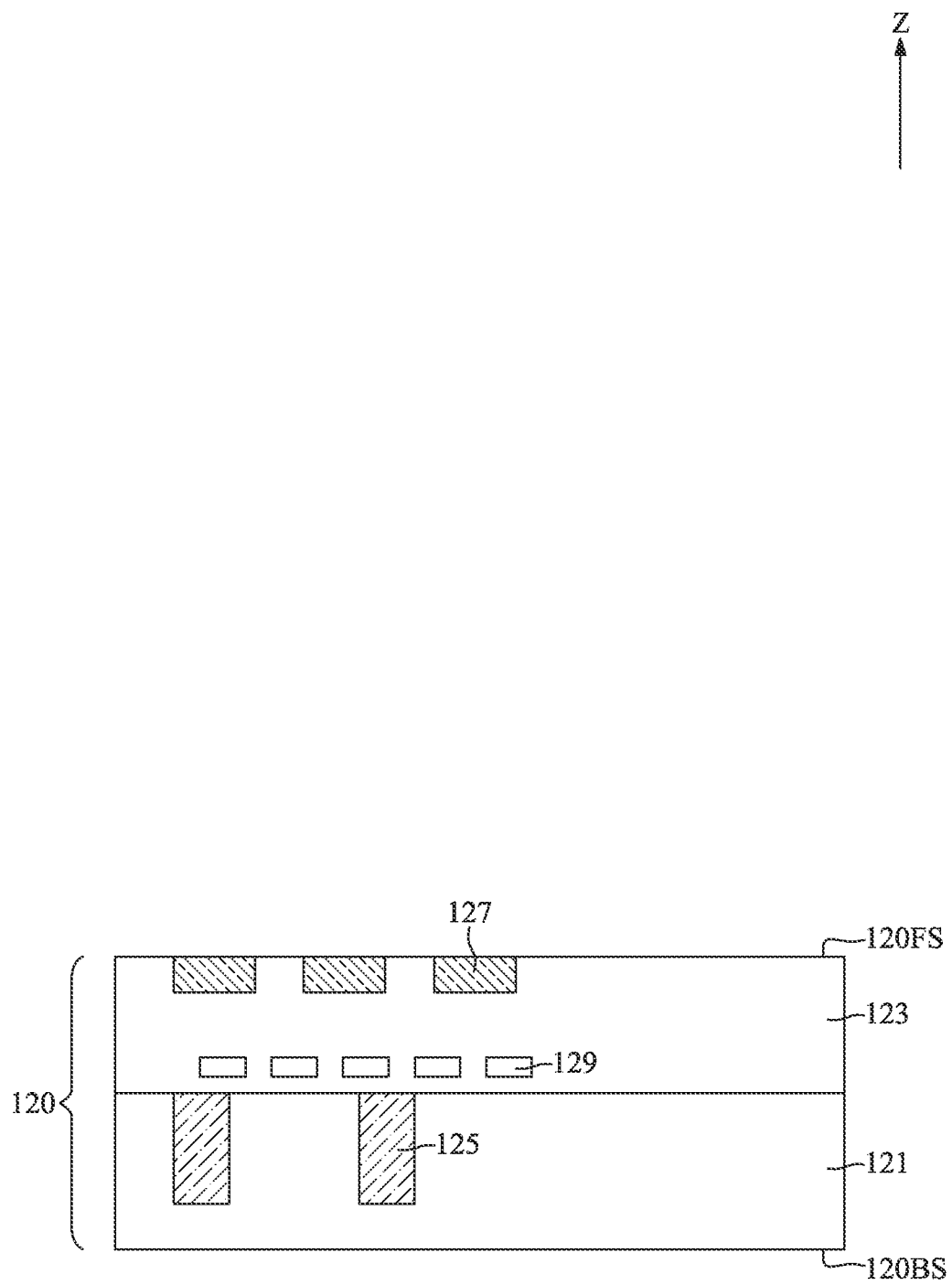

With reference to FIG. 3, a first storage die 120 may be provided. The first storage die 120 may include a substrate 121, a plurality of through substrate vias 125, a plurality of device elements (not shown for clarity), a plurality of conductive features including conductive pads 127, a plurality of first storage units 129, and a dielectric layer 123. The substrate 121, the dielectric layer 123, the device elements of the first storage die 120, and the conductive features of the first storage die 120 may be formed of structures/materials similar to the substrate 111, the dielectric layer 113, the device elements of the first controller die 110, and the conductive features of the first controller die 110, respectively and correspondingly, and descriptions thereof are not repeated herein.

In some embodiments, the first storage units 129 may be formed in the dielectric layer 123. The plurality of first storage units 129 may be configured as a floating array. The plurality of first storage units 129 may electrically couple to the conductive features of the first storage die 120. In some embodiments, the device elements of the first storage die 120, the conductive features may together configure functional units of the first storage die 120.

In some embodiments, the functional units of the first storage die 120 may only include core storage circuitry such as I/O and clocking circuit. The functional units of the first storage die 120 may not include any control circuit or high-speed circuitry. In such situation, the first storage die 120 may cooperate with the first controller die 110 including control circuit and/or high-speed circuitry. By separating the control circuit and/or high-speed circuitry from the first storage die 120, the process complexity of fabricating the first storage die 120 may be reduced. As a result, the yield and the reliability of fabricating the first storage die 120 may be improved and the cost of fabricating the first storage die 120 may be reduced.

In some embodiments, the functional units of the first storage die 120 may include storage circuitry, control circuit, and high-speed circuitry. In some embodiments, the first storage die 120 may be configured as a memory die.

In some embodiments, the top surface of the dielectric layer 123 may be referred to as the front surface 120FS of the first storage die 120. The bottom surface of the substrate 121 may be referred to as the back surface 120BS of the first storage die 120.

Figure 4:
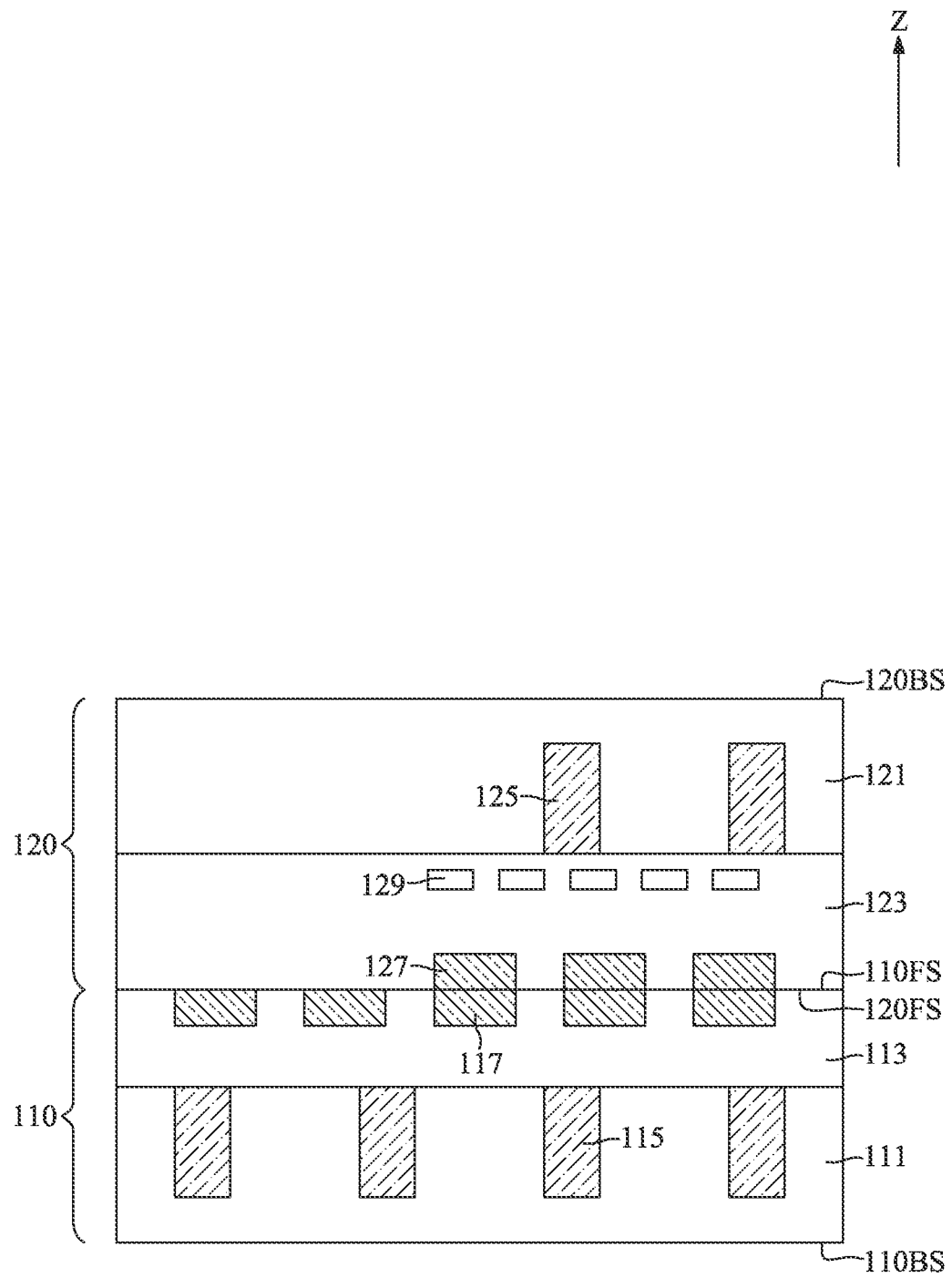

With reference to FIG. 4, the first storage die 120 may be flipped. The front surface 120FS of the first storage die 120 may be bonded onto the front surface 110FS of the first controller die 110. That is, the first storage die 120 and the first controller die 110 may bonded in a face-to-face configuration.

In some embodiments, the first storage die 120 and the first controller die 110 may be bonded through a hybrid bonding process. In some embodiments, the hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to shorten the time consuming of the hybrid bonding process. In some embodiments, the hybrid bonding process may include, for example, dielectric-to-dielectric bonding, metal-to-metal bonding, and metal-to-dielectric bonding.

In some embodiments, the dielectric-to-dielectric bonding may originate from the bonding between the dielectric layer 113 and the dielectric layer 123. The metal-to-metal bonding may originate from the bonding between the conductive pads 117 and the conductive pads 127. The metal-to-dielectric bonding may originate from the bonding between the conductive pads 127 and the dielectric layer 113 and between the conductive pads 117 and the dielectric layer 123.

In some embodiments, a thermal annealing process may be performed after the bonding process to enhance dielectric-to-dielectric bonding and to induce thermal expansion of metal-to-metal bonding so as to further improve the bonding quality.

In some embodiments, the bonding process of the first storage die 120 and the first controller die 110 may be assisted with a carrier but is not limited thereto.

Figure 5:
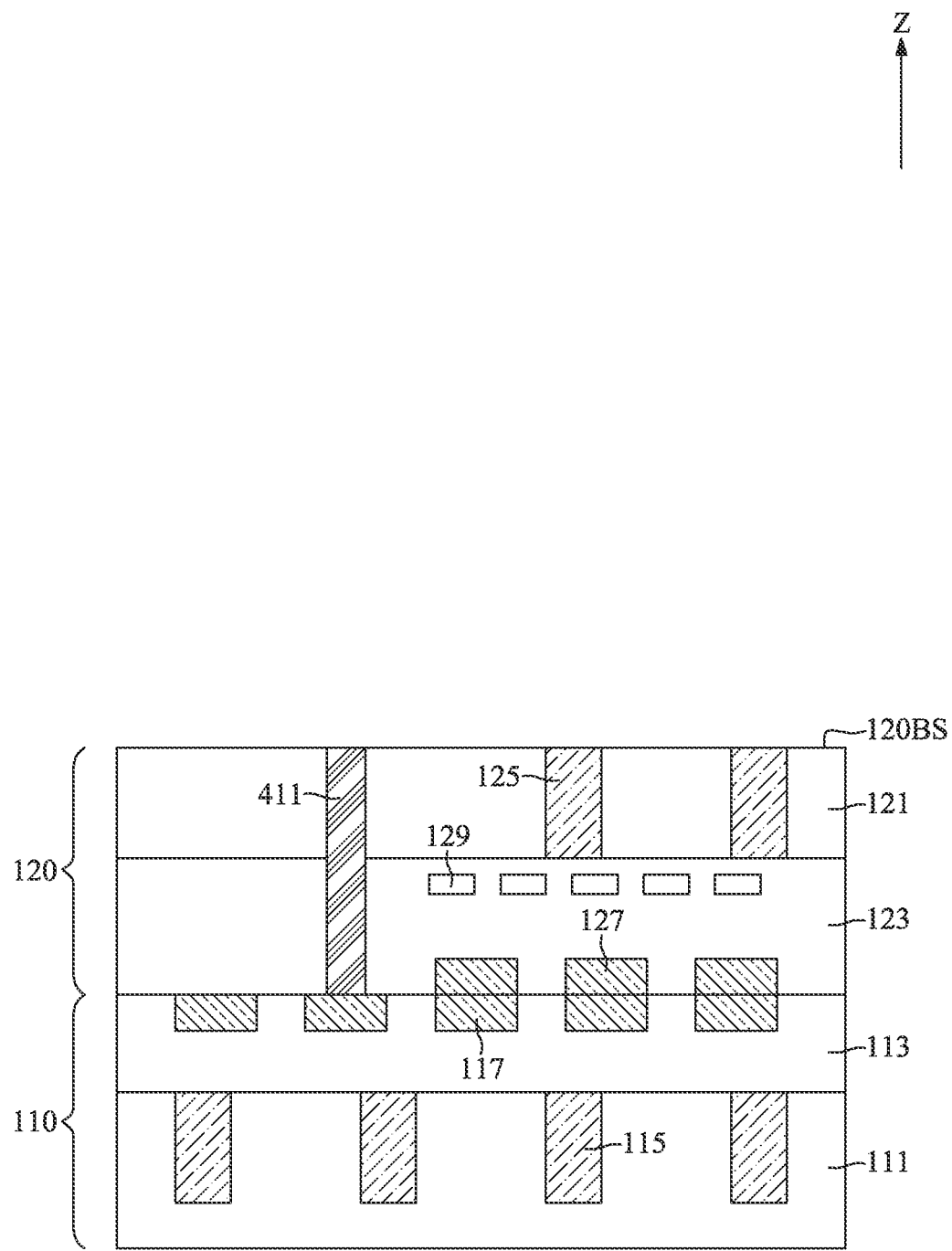

With reference to FIG. 5, the substrate 121 of the first storage die 120 may be thinned through a thinning process using wafer grinding, mechanical abrasion, polishing, or the like, or using chemical removal, such as a wet etch. In some embodiments, the thinning process of the first storage die 120 may be assisted with a carrier but is not limited thereto. After the thinning process, the thickness of the substrate 121 may be between about 5 μm and 100 μm.

With reference to FIG. 5, a first through die via 411 may be formed along the first storage die 120 to electrically connect to the first controller die 110. Detailedly, the first through die via 411 may be formed along the substrate 121 and the dielectric layer 123, on the corresponding conductive pad 117, and electrically connected to the corresponding conductive pad 117.

Figure 6:
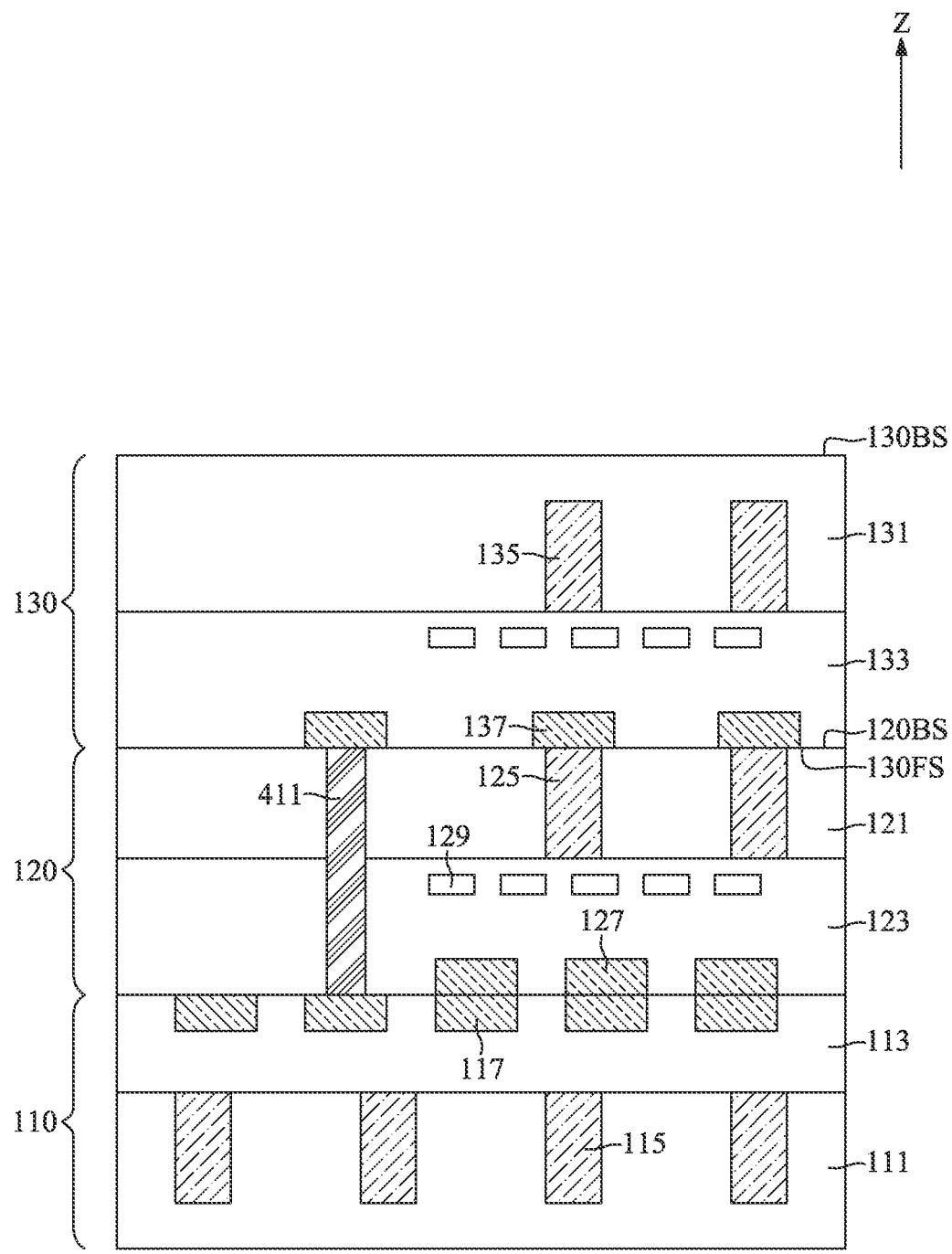

With reference to FIG. 6, a first storage die 130 which have structure similar to the first storage die 120 is provided, and descriptions thereof are not repeated herein. The front surface 130FS of the first storage die 130 may be bonded on the back surface 120BS of the first storage die 120. That is, the first storage die 130 and the first storage die 120 may be bonded in a face-to-back configuration. The conductive pads 137 of the first storage die 130 may be electrically connected to the corresponding through substrate vias 125.

Figure 7:
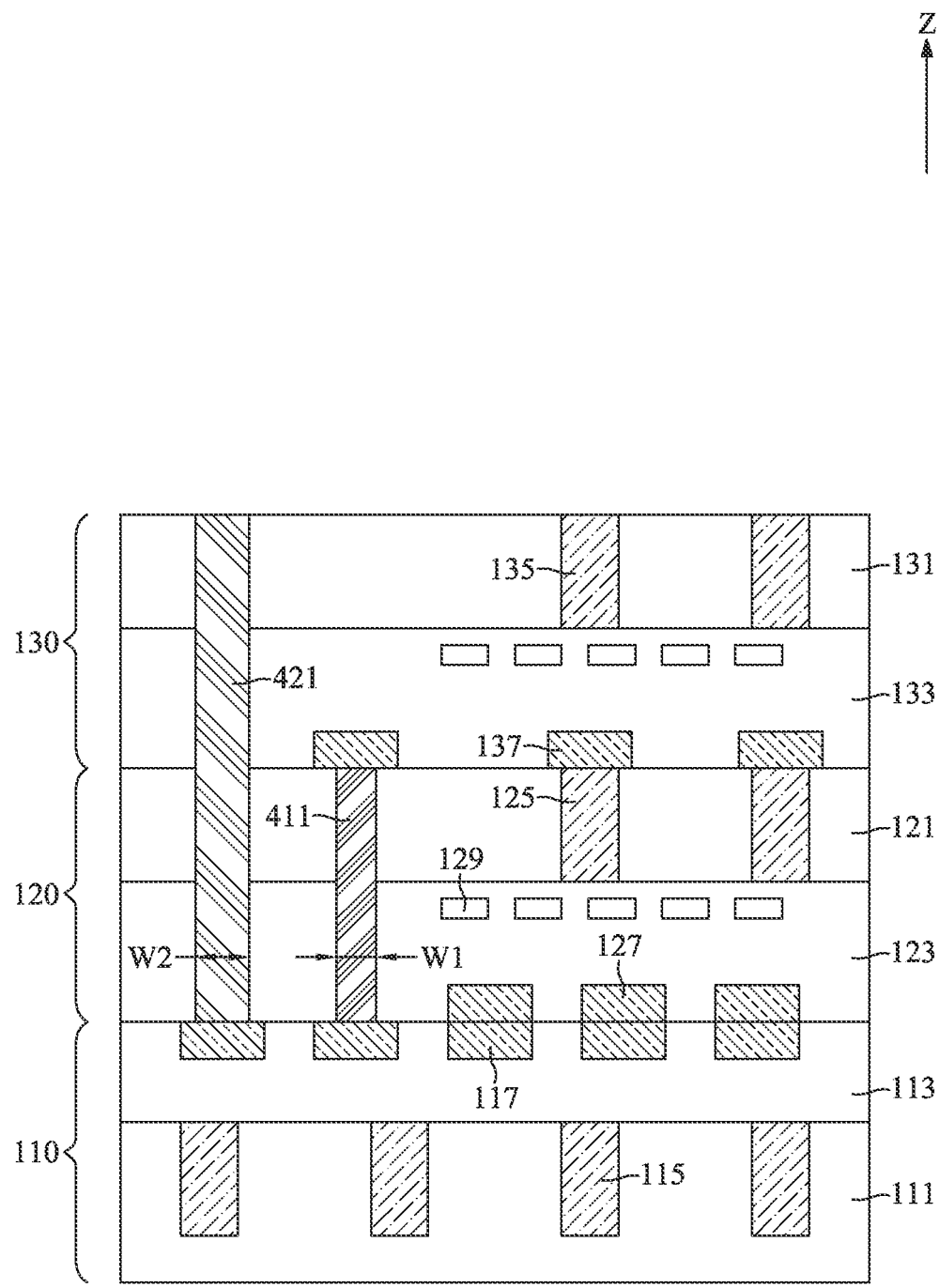

With reference to FIG. 7, the substrate 131 of the first storage die 130 may be thinned through a thinning process using wafer grinding, mechanical abrasion, polishing, or the like, or using chemical removal, such as a wet etch. In some embodiments, the thinning process of the first storage die 130 may be assisted with a carrier but is not limited thereto. After the thinning process, the thickness of the substrate 131 may be between about 5 μm and 100 μm.

With reference to FIG. 7, a second through die via 421 may be formed along the first storage dies 120, 130 to electrically connect to the first controller die 110. Detailedly, the second through die via 421 may be formed along the substrate 131, the dielectric layer 133, the substrate 121, and the dielectric layer 123, formed on the corresponding conductive pad 117, and electrically connected to the corresponding conductive pad 117.

In some embodiments, the width W1 of the first through die via 411 may be less than the width W2 of the second through die via 421.

Figure 8:
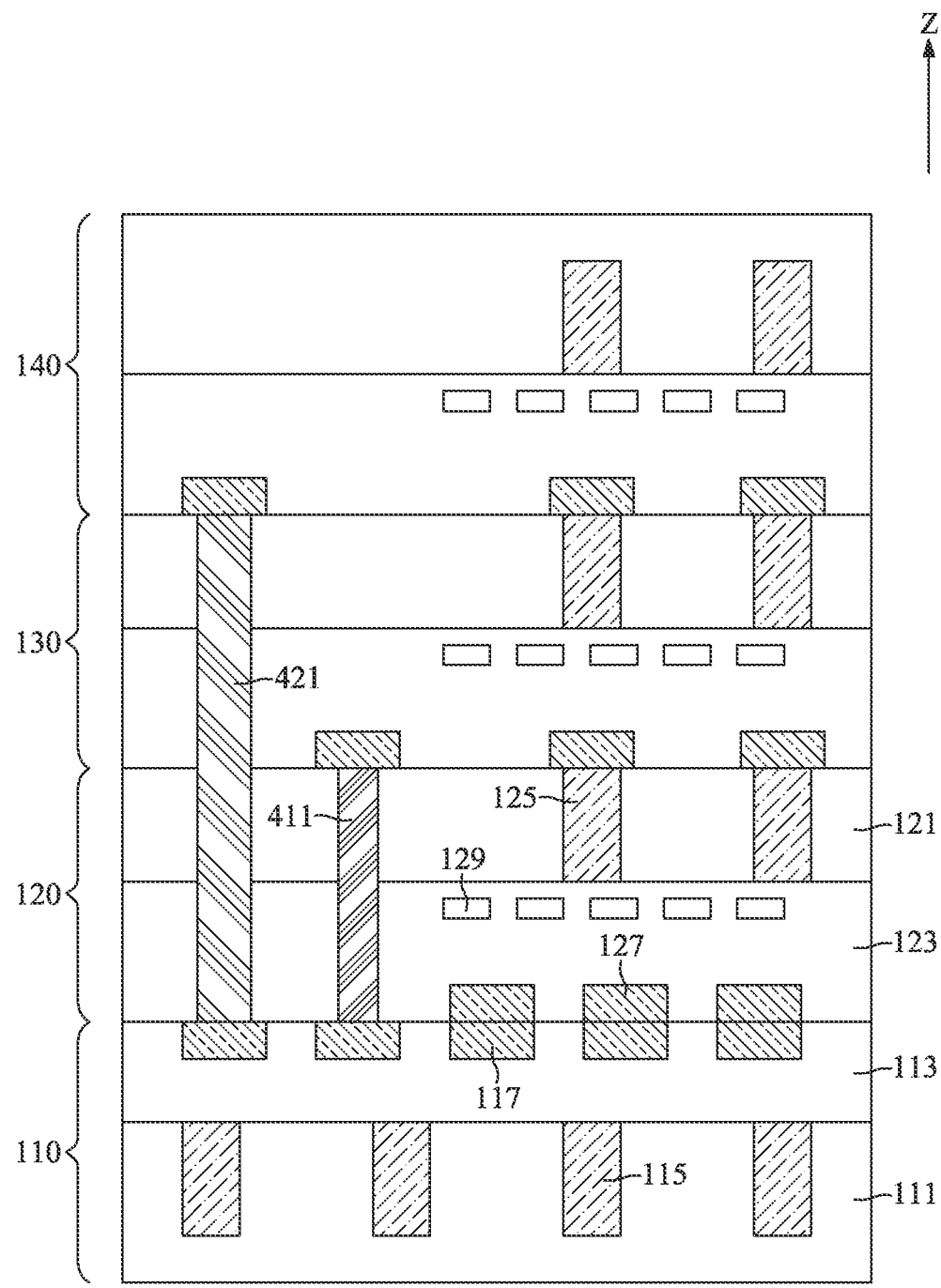
Figure 9:
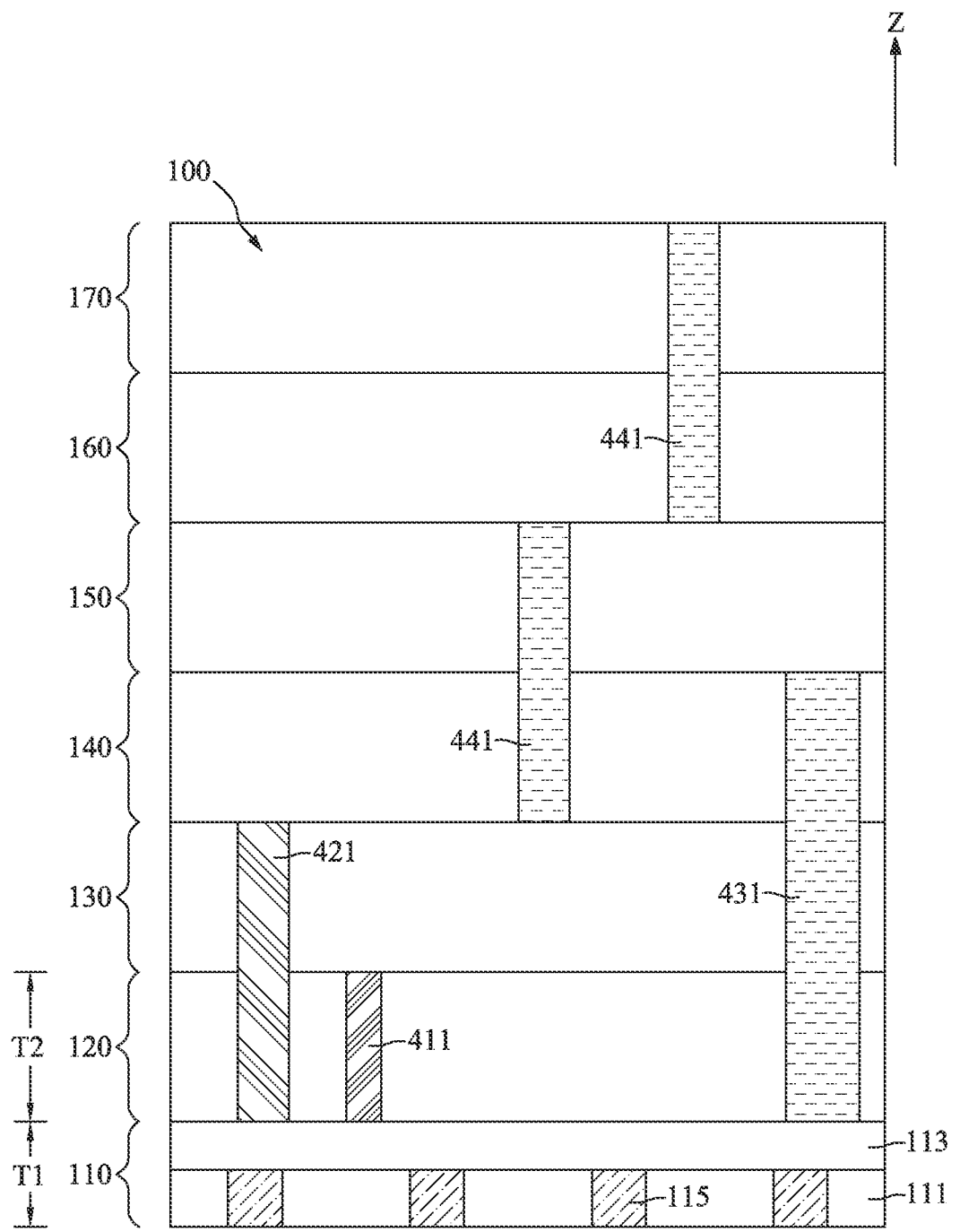

With reference to FIGS. 8 and 9, first storage dies 140, 150, 160, 170 which have structures similar to the first storage die 120 may be respectively provided, and descriptions thereof are not repeated herein. The first storage dies 140, 150, 160, 170 may be sequentially bonded on to the first storage die 130 with procedures similar to the bonding process between the first storage die 120 and the first storage die 130, and descriptions thereof are not repeated herein.

In some embodiments, a third through die via 431 may be formed along the first storage dies 120, 130, 140 to electrically connect to the first controller die 110. The third through die via 431 may have a width greater than that of the first through die via 411 and the second through die via 421. In some embodiments, first storage dies may be electrically connected through fourth through die vias 441. For example, the fourth through die via 441 may be formed along the first storage dies 160, 170 to electrically connect the first storage dies 160, 170. For another example, the fourth through die via 441 may be formed along the first storage dies 140, 150 to electrically connect the first storage dies 140, 150.

The first storage dies 120, 130, 140, 150, 160, 170, the first controller die 110, the first through die via 411, the second through die via 421, the third through die via 431, and the fourth through die vias 441 may together configure the first stacking structure 100. The first stacking structure 100 may be configured as a non-volatile memory such as a NAND memory. It should be noted that the number of the first storage dies are just for illustration only, the number of the first storage dies may be greater than or less than that shown in figures.

Figure 10:
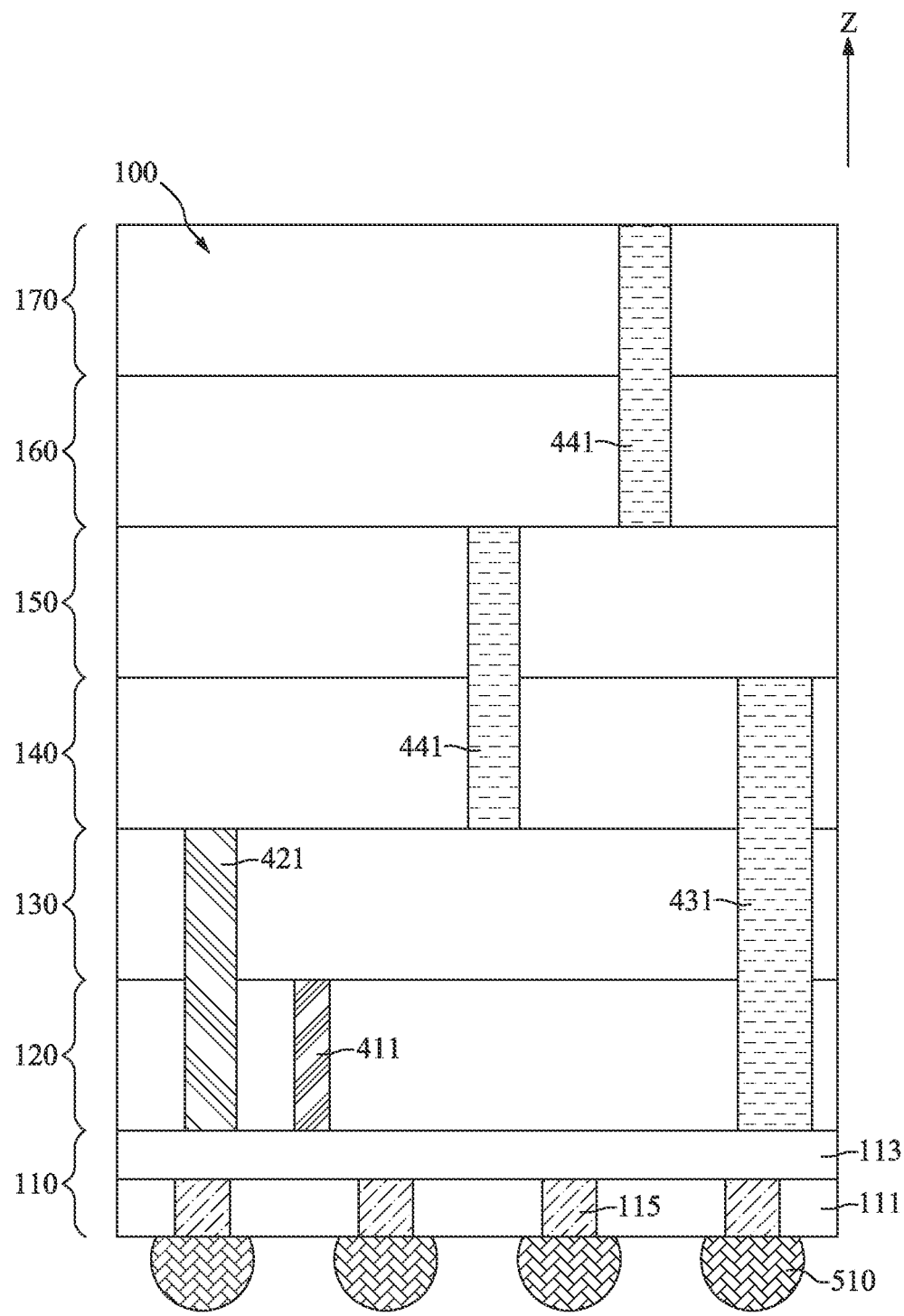

With reference to FIG. 10, the substrate 111 of the first controller die 110 may be thinned through a thinning process using wafer grinding, mechanical abrasion, polishing, or the like, or using chemical removal, such as a wet etch. The through substrate vias 115 may be exposed after the thinning process.

In some embodiments, due to the first storage dies 120, 130, 140, 150, 160, 170, the thinning process of the first controller die 110 may be performed without a carrier due to the first storage dies 120, 130, 140, 150, 160, 170 can be served as temporarily carrier. As a result, the cost and process complexity may be reduced. After the thinning process, the thickness of the substrate 111 may be between about 5 μm and 100 μm.

In some embodiments, the thickness T1 of the first controller die 110 may be less than the thickness T2 of the first storage die 120. In some embodiments, the thickness T1 of the first controller die 110 may be substantially the same as the thickness T2 of the first storage die 120.

With reference to FIG. 10, the first interconnect units 510 may be formed under the substrate 111 and electrically connected to the through substrate vias 115, respectively and correspondingly. In some embodiments, the first interconnect units 510 may be micro-bumps and may include lead, tin, indium, bismuth, antimony, silver, gold, copper, nickel, or alloy thereof. In some embodiments, the first interconnect units 510 may be solder balls, and may be formed under the substrate 111 by using a thermal compression process and/or a reflow process.

With reference to FIG. 1 and FIGS. 11 to 19, at step S13, a second stacking structure 200 may be provided and a plurality of second interconnect units 520 may be formed under the second stacking structure 200.

Figure 11:
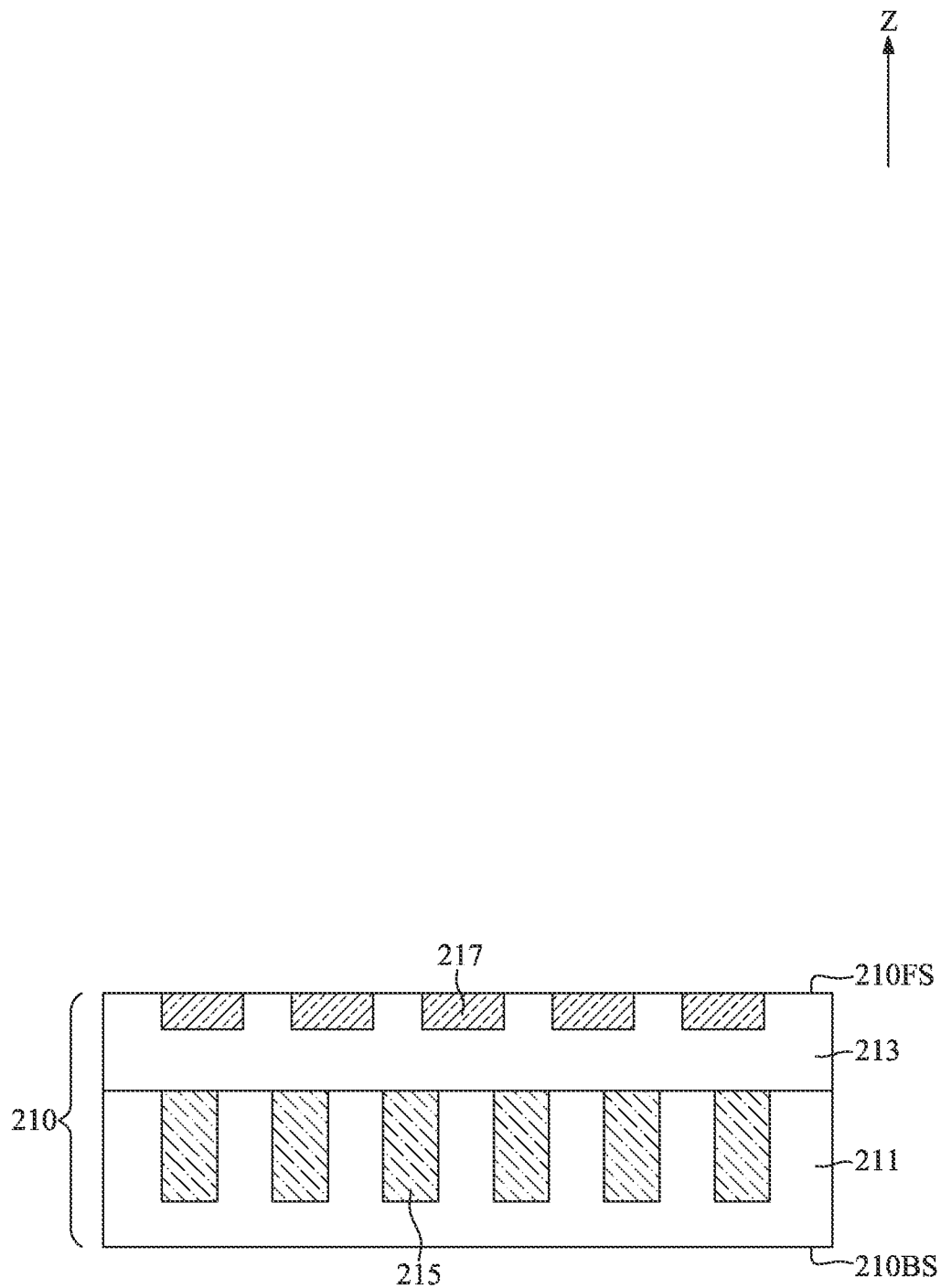

With reference to FIG. 11, a second controller die 210 may be provided. The second controller die 210 may include a substrate 211, a plurality of through substrate vias 215, a plurality of device elements (not shown for clarity), a plurality of conductive features including conductive pads 217, and a dielectric layer 213.

In some embodiments, the substrate 211 of the second controller die 210 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the through substrate vias 215 of the second controller die 210 may be formed in the substrate 211. The top surfaces of the through substrate vias 215 may be substantially coplanar with the top surface of the substrate 211. In some embodiments, the through substrate vias 215 may be formed by a via-first process. In some embodiments, the through substrate vias 215 may be formed by a via-middle process or a via-last process.

In some embodiments, the plurality of device elements of the second controller die 210 may be formed on the substrate 211. The device elements may be transistors such as complementary metal-oxide-semiconductor transistors, metal-oxide-semiconductor field-effect transistors, fin field-effect-transistors, the like, or a combination thereof.

In some embodiments, the dielectric layer 213 may be formed on the substrate 211. The dielectric layer 213 may be a stacked layer structure. The dielectric layer 213 may include a plurality of insulating sub-layers. Each of the insulating sub-layers may have a thickness between about 0.5 μm and about 3.0 μm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the conductive features of the second controller die 210 may be formed in the dielectric layer 213. The conductive features may include conductive lines (not shown), conductive vias (not shown), and the conductive pads 217. The conductive lines may be separated from each other and may be horizontally disposed in the dielectric layer 213 along the direction Z. In the present embodiment, the topmost conductive lines may be designated as the conductive pads 217. The top surfaces of the conductive pads 217 and the top surface of the dielectric layer 213 may be substantially coplanar. The conductive vias may connect adjacent conductive lines along the direction Z, adjacent device element and conductive line, and adjacent conductive pad 117 and conductive line.

In some embodiments, the conductive features of the second controller die 210 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The conductive features may be formed during the formation of the dielectric layer 213.

In some embodiments, the device elements and the conductive features of the second controller die 210 may together configure functional units of the second controller die 210. In some embodiments, the functional units of the second controller die 210 may include, for example, highly complex circuits such as memory controllers or accelerator units. In some embodiments, the functional units of the second controller die 210 may include control circuit and high-speed circuitry that are associated with a memory. In some embodiments, the second controller die 210 may be configured as a controller die of a memory die.

In some embodiments, the top surface of the dielectric layer 213 may be referred to as the front surface 210FS of the second controller die 210. The bottom surface of the substrate 211 may be referred to as the back surface 210BS of the second controller die 210.

Figure 12:
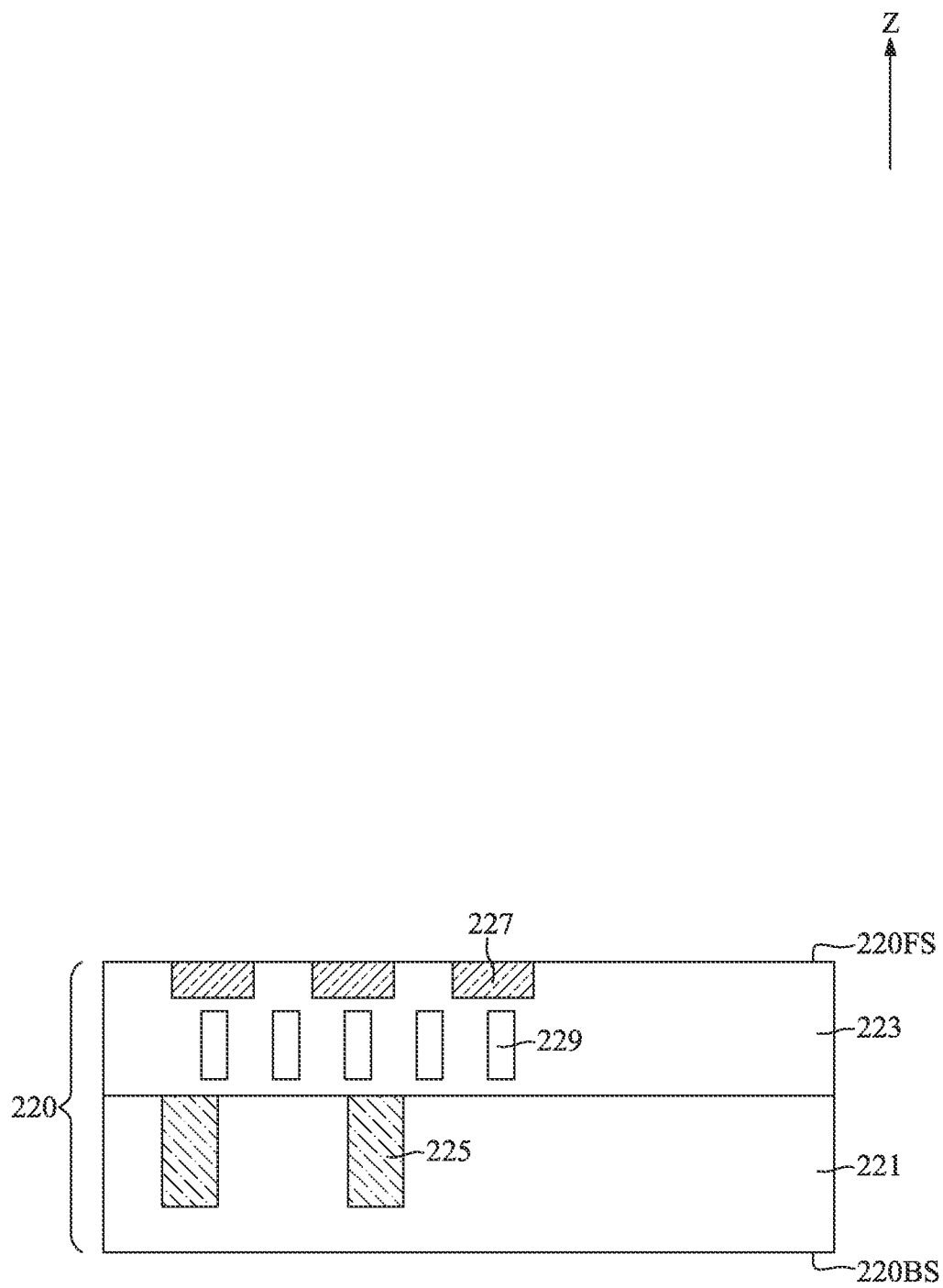

With reference to FIG. 12, a second storage die 220 may be provided. The second storage die 220 may include a substrate 221, a plurality of through substrate vias 225, a plurality of device elements (not shown for clarity), a plurality of conductive features including conductive pads 227, a plurality of second storage units 229, and a dielectric layer 223. The substrate 221, the dielectric layer 223, the device elements of the second storage die 220, and the conductive features of the second storage die 220 may be formed of structures/materials similar to the substrate 221, the dielectric layer 223, the device elements of the second controller die 210, and the conductive features of the second controller die 210, respectively and correspondingly, and descriptions thereof are not repeated herein.

In some embodiments, the second storage units 229 may be formed in the dielectric layer 223. Each of the second storage units 229 may include an insulator-conductor-insulator structure. The second storage units 229 may electrically couple to the conductive features of the second storage die 220, respectively and correspondingly. In some embodiments, the device elements of the second storage die 220, the conductive features may together configure functional units of the second storage die 220.

In some embodiments, the functional units of the second storage die 220 may only include core storage circuitry such as I/O and clocking circuit. The functional units of the second storage die 220 may not include any control circuit or high-speed circuitry. In such situation, the second storage die 220 may cooperate with the second controller die 210 including control circuit and/or high-speed circuitry. By separating the control circuit and/or high-speed circuitry from the second storage die 220, the process complexity of fabricating the second storage die 220 may be reduced. As a result, the yield and the reliability of fabricating the second storage die 220 may be improved and the cost of fabricating the second storage die 220 may be reduced.

In some embodiments, the functional units of the second storage die 220 may include storage circuitry, control circuit, and high-speed circuitry. In some embodiments, the second storage die 220 may be configured as a memory die.

In some embodiments, the top surface of the dielectric layer 223 may be referred to as the front surface 220FS of the second storage die 220. The bottom surface of the substrate 221 may be referred to as the back surface 220BS of the second storage die 220.

Figure 13:
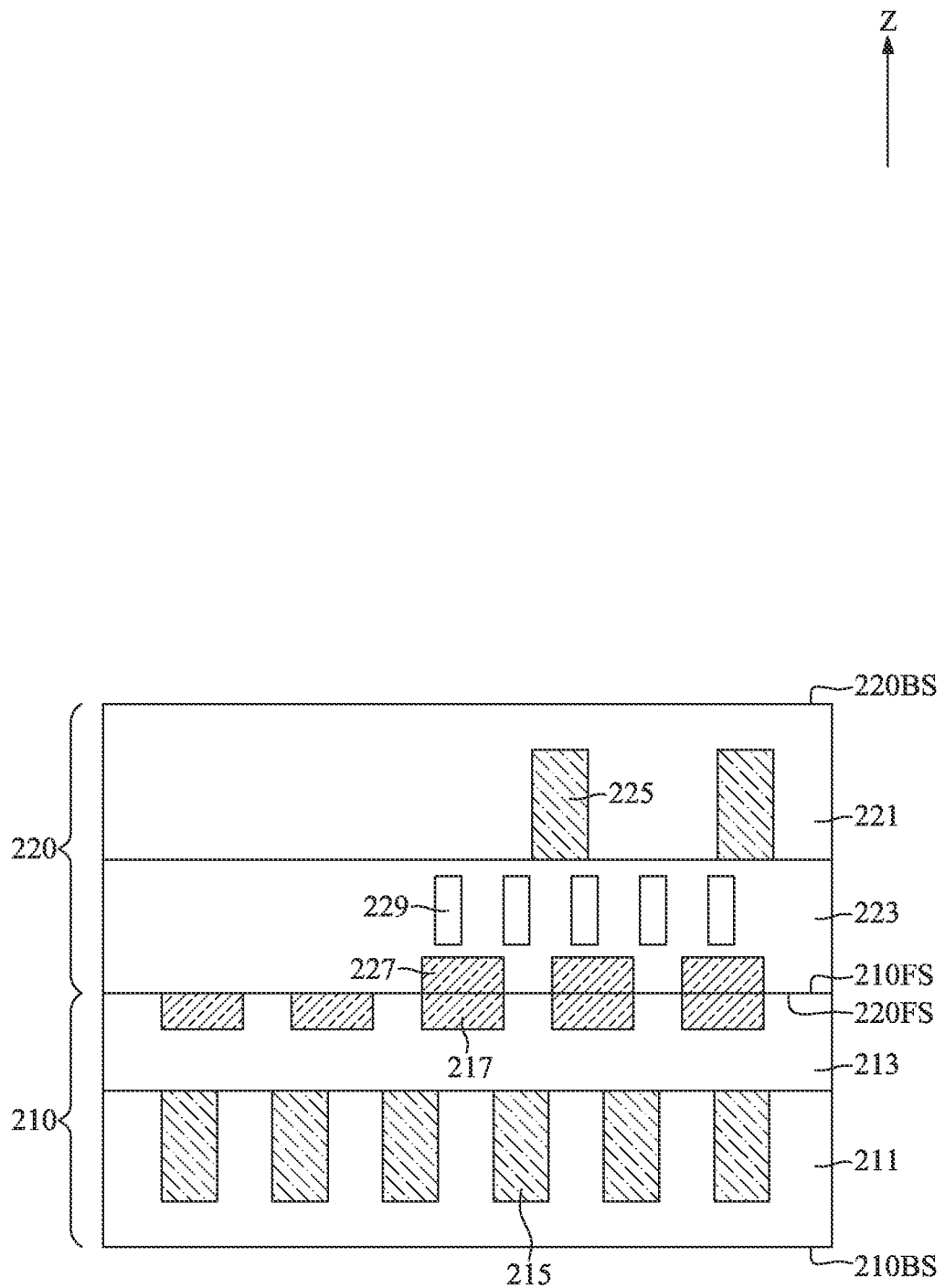

With reference to FIG. 13, the second storage die 220 may be flipped. The front surface 220FS of the second storage die 220 may be bonded onto the front surface 210FS of the second controller die 210. That is, the second storage die 220 and the second controller die 210 may bonded in a face-to-face configuration.

In some embodiments, the second storage die 220 and the second controller die 210 may be bonded through a hybrid bonding process. In some embodiments, the hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to shorten the time consuming of the hybrid bonding process. In some embodiments, the hybrid bonding process may include, for example, dielectric-to-dielectric bonding, metal-to-metal bonding, and metal-to-dielectric bonding.

In some embodiments, the dielectric-to-dielectric bonding may originate from the bonding between the dielectric layer 213 and the dielectric layer 223. The metal-to-metal bonding may originate from the bonding between the conductive pads 217 and the conductive pads 227. The metal-to-dielectric bonding may originate from the bonding between the conductive pads 227 and the dielectric layer 213 and between the conductive pads 217 and the dielectric layer 223.

In some embodiments, a thermal annealing process may be performed after the bonding process to enhance dielectric-to-dielectric bonding and to induce thermal expansion of metal-to-metal bonding so as to further improve the bonding quality.

In some embodiments, the bonding process of the second storage die 220 and the second controller die 210 may be assisted with a carrier but is not limited thereto.

Figure 14:
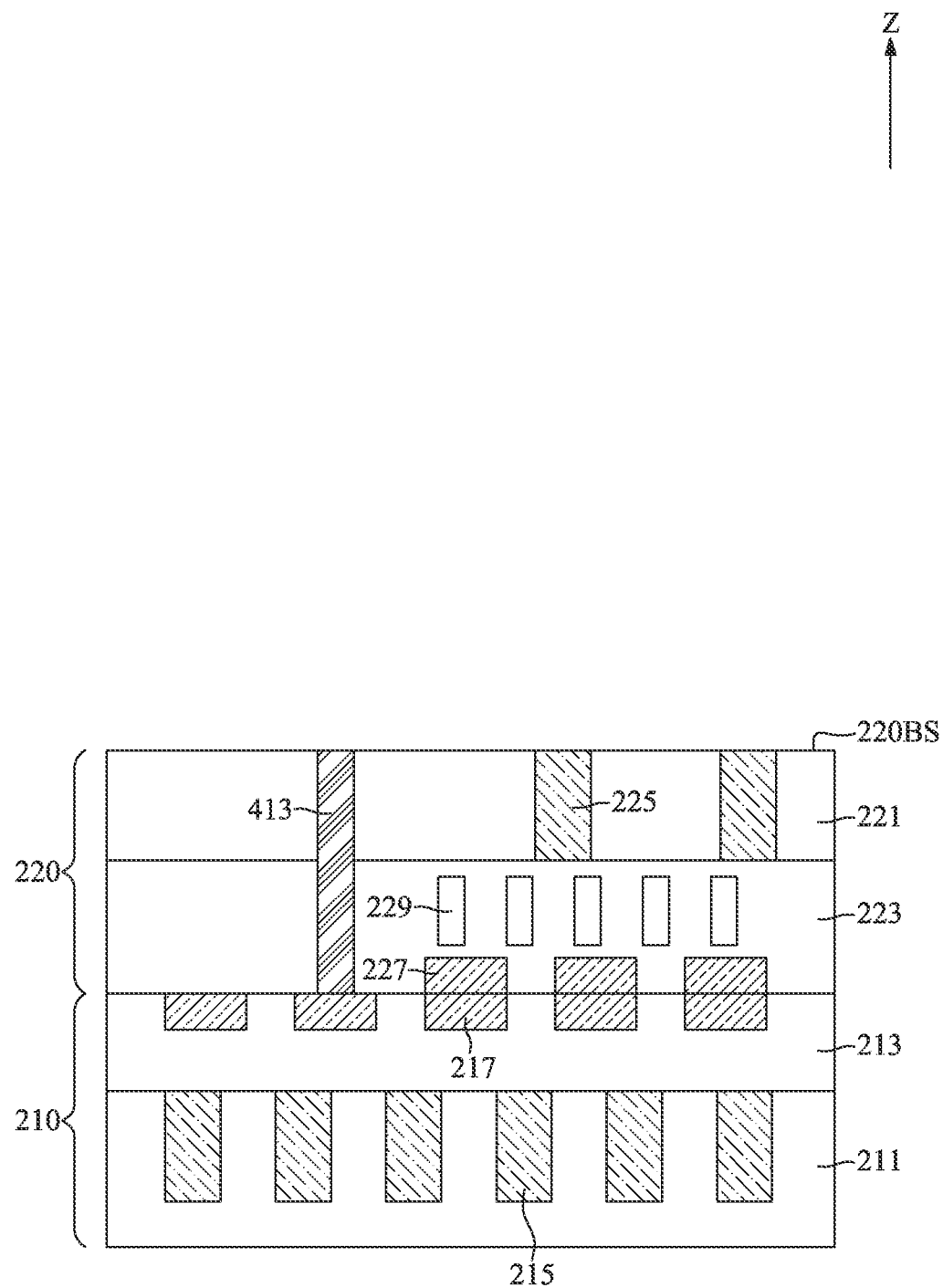

With reference to FIG. 14, the substrate 221 of the second storage die 220 may be thinned through a thinning process using wafer grinding, mechanical abrasion, polishing, or the like, or using chemical removal, such as a wet etch. In some embodiments, the thinning process of the second storage die 220 may be assisted with a carrier but is not limited thereto. After the thinning process, the thickness of the substrate 221 may be between about 5 µm and 100 µm.

With reference to FIG. 14, a first through die via 413 may be formed along the second storage die 220 to electrically connect to the second controller die 210. Detailedly, the first through die via 413 may be formed along the substrate 221 and the dielectric layer 223, on the corresponding conductive pad 217, and electrically connected to the corresponding conductive pad 217.

Figure 15:
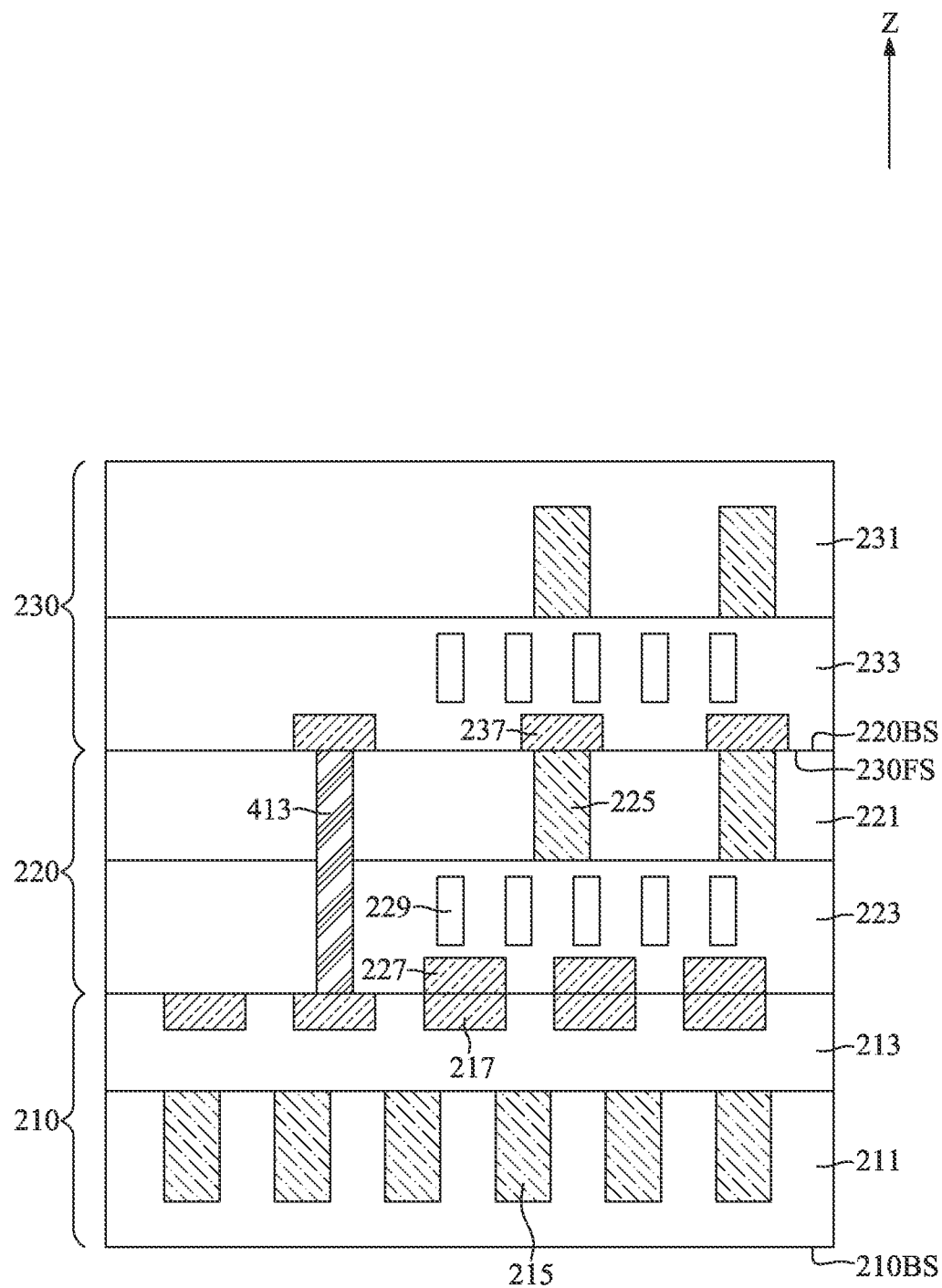

With reference to FIG. 15, a second storage die 230 which have structure similar to the second storage die 220 is provided, and descriptions thereof are not repeated herein. The front surface 230FS of the second storage die 230 may be bonded on the back surface 220BS of the second storage die 220. That is, the second storage die 230 and the second storage die 220 may be bonded in a face-to-back configuration. The conductive pads 237 of the second storage die 230 may be electrically connected to the corresponding through substrate vias 225.

Figure 16:
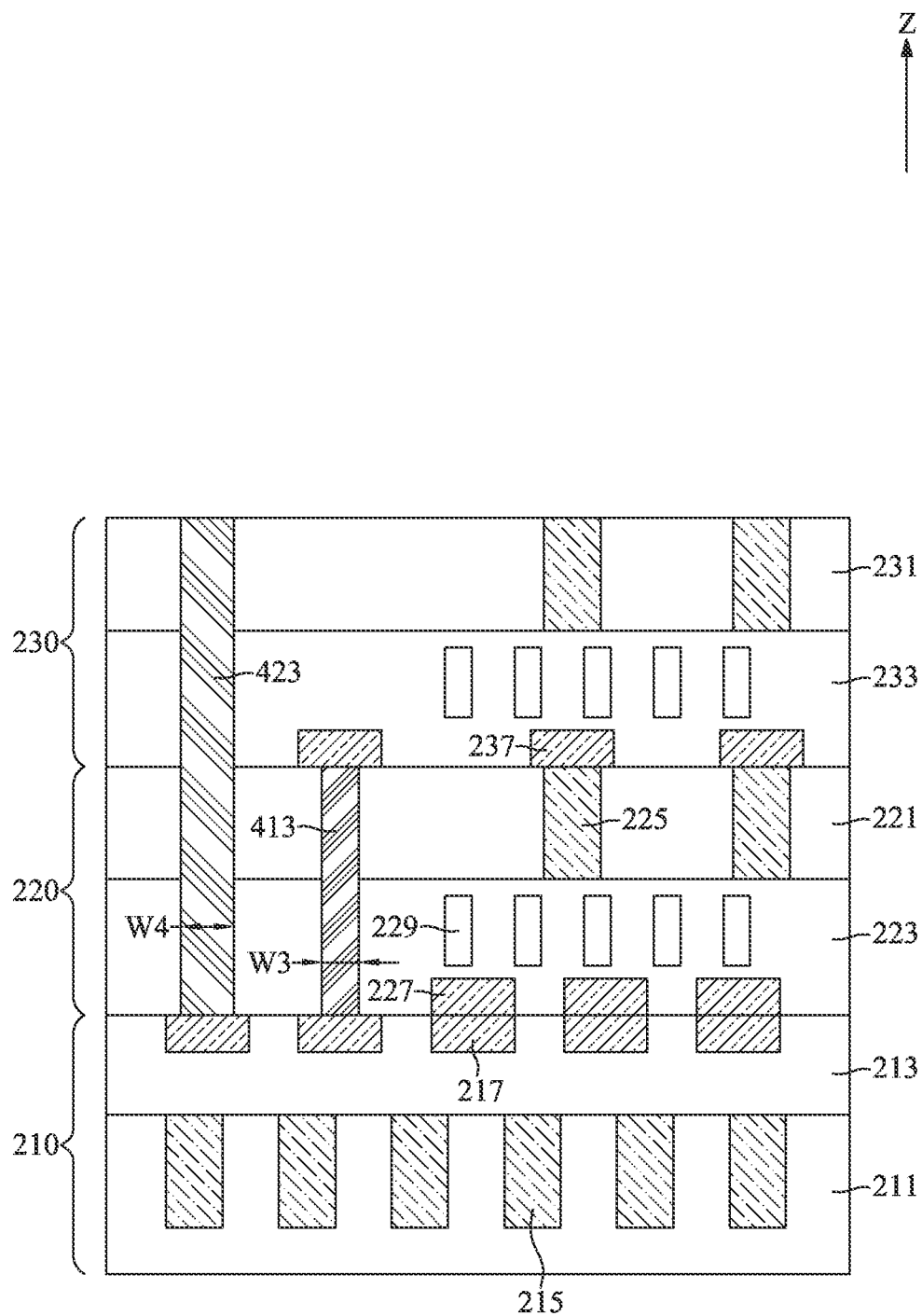

With reference to FIG. 16, the substrate 231 of the second storage die 230 may be thinned through a thinning process using wafer grinding, mechanical abrasion, polishing, or the like, or using chemical removal, such as a wet etch. In some embodiments, the thinning process of the second storage die 230 may be assisted with a carrier but is not limited thereto. After the thinning process, the thickness of the substrate 231 may be between about 5 µm and 100 µm.

With reference to FIG. 16, a second through die via 423 may be formed along the second storage dies 220, 230 to electrically connect to the second controller die 210. Detailedly, the second through die via 423 may be formed along the substrate 231, the dielectric layer 233, the substrate 221, and the dielectric layer 123, formed on the corresponding conductive pad 217, and electrically connected to the corresponding conductive pad 217.

In some embodiments, the width W3 of the first through die via 413 may be less than the width W4 of the second through die via 423.

Figure 17:
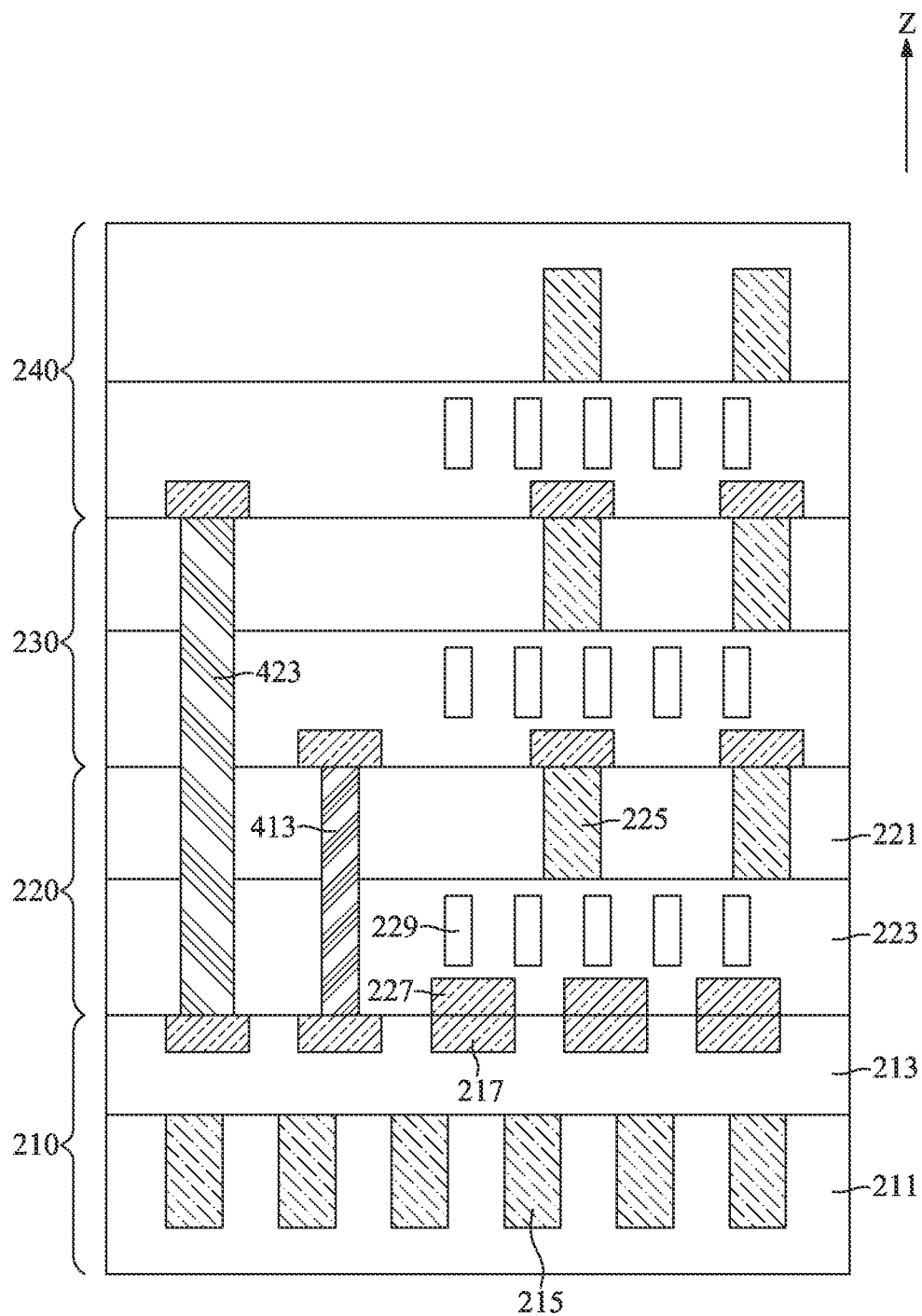
Figure 18:
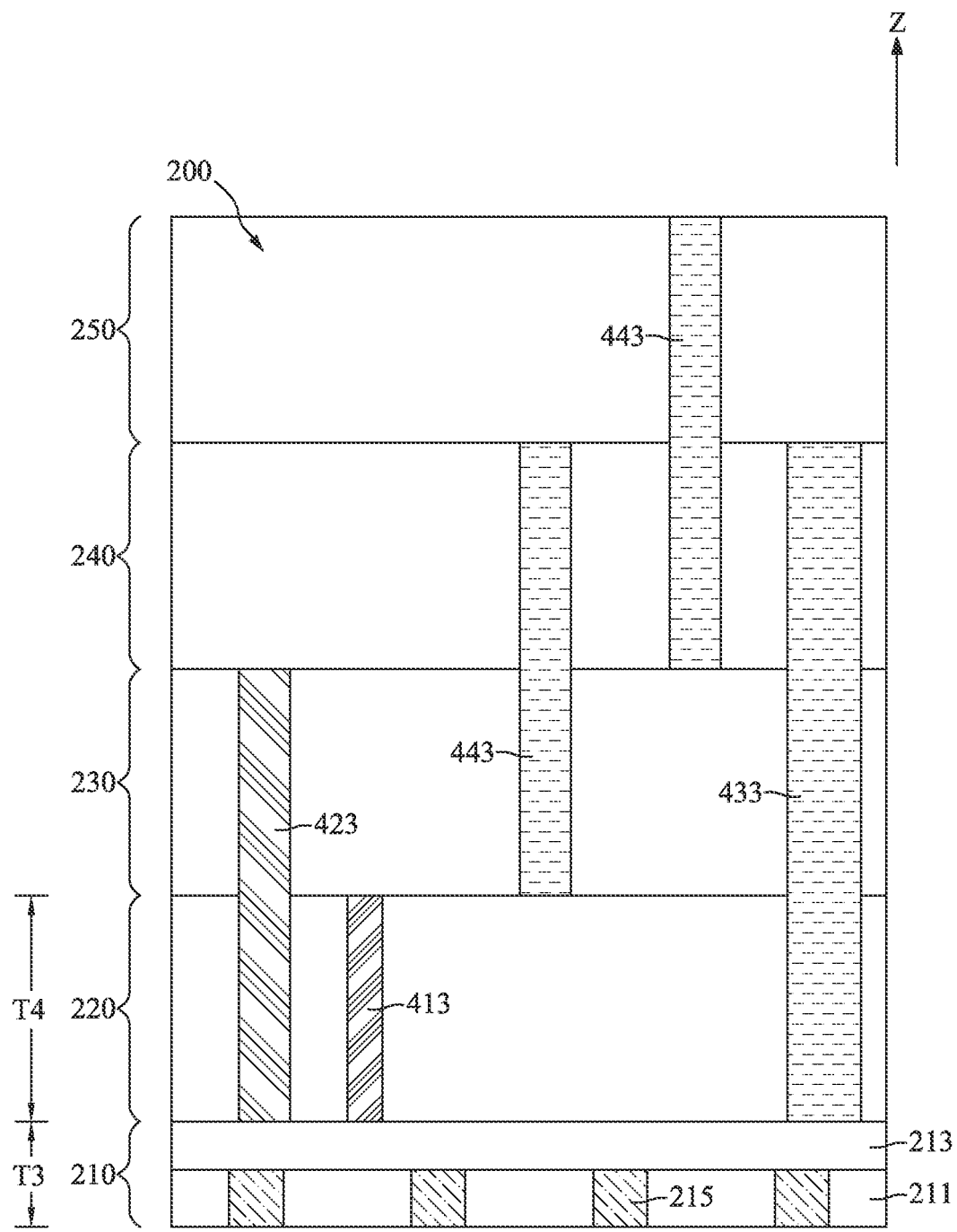

With reference to FIGS. 17 and 18, second storage dies 240, 250 which have structures similar to the second storage die 220 may be respectively provided, and descriptions thereof are not repeated herein. The second storage dies 240, 250 may be sequentially bonded on to the second storage die 230 with procedures similar to the bonding process between the second storage die 220 and the second storage die 230, and descriptions thereof are not repeated herein.

In some embodiments, a third through die via 433 may be formed along the second storage dies 220, 230, 240 to electrically connect to the second controller die 210. The third through die via 433 may have a width greater than that of the first through die via 413 and the second through die via 423. In some embodiments, second storage dies may be electrically connected through fourth through die vias 443. For example, the fourth through die via 443 may be formed along the second storage dies 240, 250 to electrically connect the second storage dies 240, 250. For another example, the fourth through die via 443 may be formed along the second storage dies 230, 240 to electrically connect the second storage dies 230, 240.

The second storage dies 220, 230, 240, 250, the second controller die 210, the first through die via 413, the second through die via 423, the third through die via 433, and the fourth through die vias 443 may together configure the second stacking structure 200. The second stacking structure 200 may be configured as a volatile memory such as a dynamic random access memory. It should be noted that the number of the second storage dies are just for illustration only, the number of the second storage dies may be greater than or less than that shown in figures.

With reference to FIG. 18, the substrate 211 of the second controller die 210 may be thinned through a thinning process using wafer grinding, mechanical abrasion, polishing, or the like, or using chemical removal, such as a wet etch. The through substrate vias 225 may be exposed after the thinning process.

In some embodiments, due to the second storage dies 220, 230, 240, 250, the thinning process of the second controller die 210 may be performed without a carrier due to the second storage dies 220, 230, 240, 250 can be served as temporarily carrier. As a result, the cost and process complexity may be reduced. After the thinning process, the thickness of the substrate 211 may be between about 5 µm and 100 µm.

In some embodiments, the thickness T3 of the second controller die 210 may be less than the thickness T4 of the second storage die 220. In some embodiments, the thickness T3 of the second controller die 210 may be substantially the same as the thickness T4 of the second storage die 220.

Figure 19:
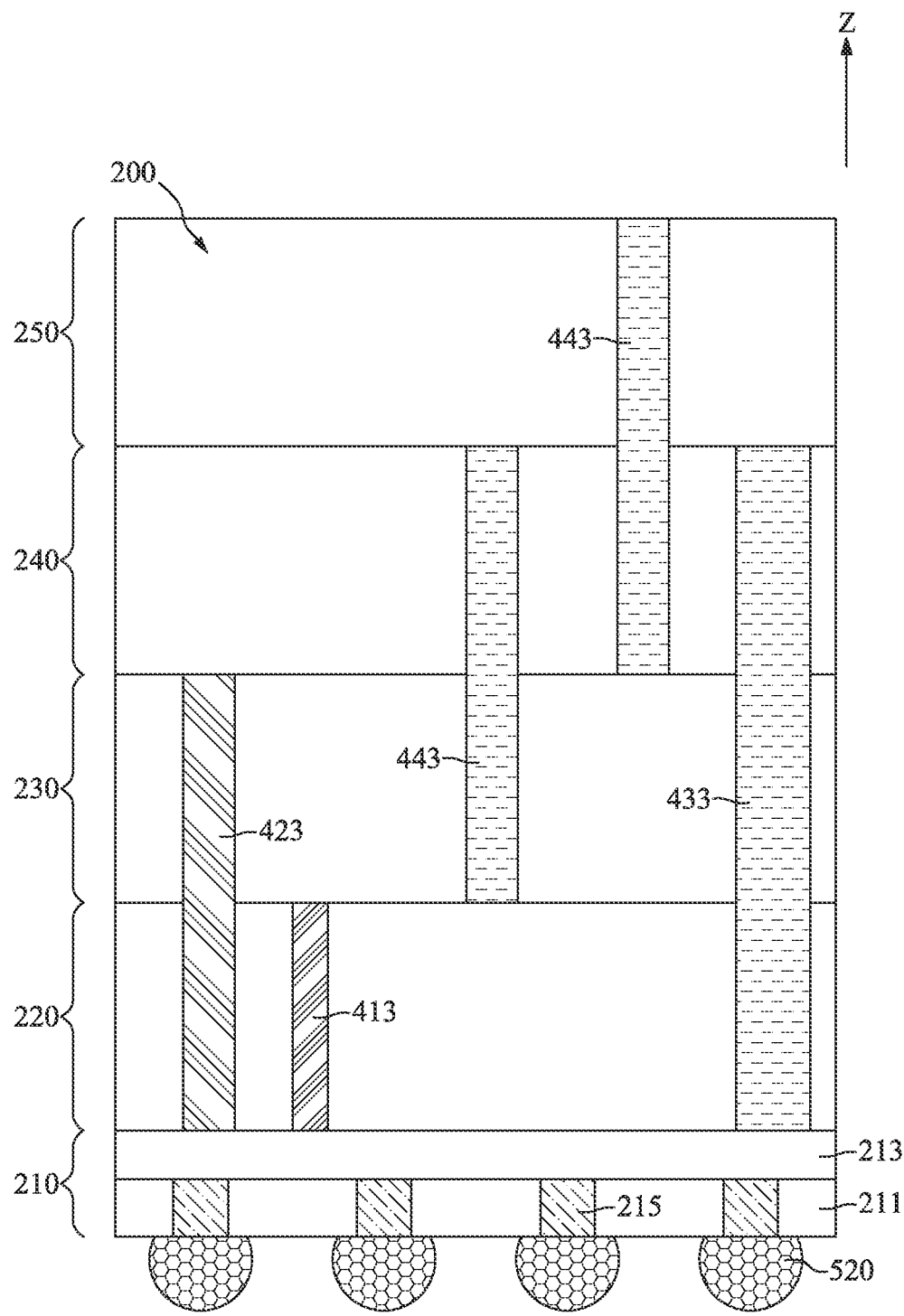

With reference to FIG. 19, the second interconnect units 520 may be formed under the substrate 211 and electrically connected to the through substrate vias 215, respectively and correspondingly. In some embodiments, the second interconnect units 520 may be micro-bumps and may include lead, tin, indium, bismuth, antimony, silver, gold, copper, nickel, or alloy thereof. In some embodiments, the second interconnect units 520 may be solder balls, and may be formed under the substrate 211 by using a thermal compression process and/or a reflow process.

With reference to FIG. 1 and FIGS. 20 to 25, at step S15, a bottom die 310 may be provided, the first stacking structure 100 may be bonded onto the bottom die 310, and the second stacking structure 200 be bonded onto the bottom die 310.

Figure 20:
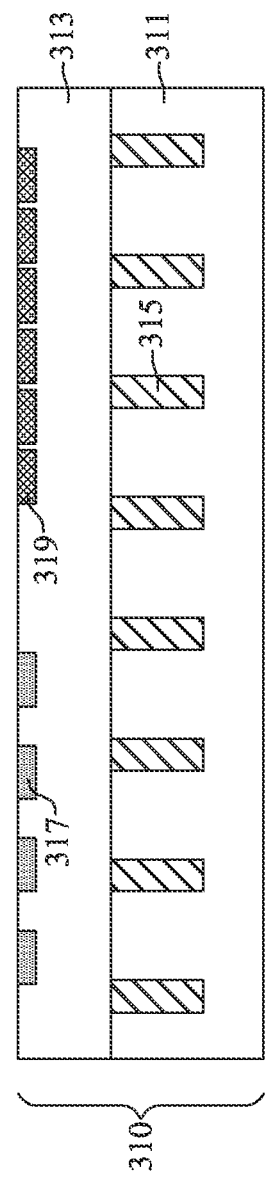

With reference to FIG. 20, the bottom die 310 may include a substrate 311, a plurality of through substrate vias 315, a plurality of device elements (not shown for clarity), a plurality of conductive features including first connecting pads 317 and second connecting pads 319, and a dielectric layer 313.

In some embodiments, the substrate 311 of the bottom die 310 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the through substrate vias 315 of the bottom die 310 may be formed in the substrate 311. The top surfaces of the through substrate vias 315 may be substantially coplanar with the top surface of the substrate 311. In some embodiments, the through substrate vias 315 may be formed by a via-first process. In some embodiments, the through substrate vias 315 may be formed by a via-middle process or a via-last process.

In some embodiments, the plurality of device elements of the bottom die 310 may be formed on the substrate 311. The device elements may be transistors such as complementary metal-oxide-semiconductor transistors, metal-oxide-semiconductor field-effect transistors, fin field-effect-transistors, the like, or a combination thereof.

In some embodiments, the dielectric layer 313 may be formed on the substrate 311. The dielectric layer 313 may be a stacked layer structure. The dielectric layer 313 may include a plurality of insulating sub-layers. Each of the insulating sub-layers may have a thickness between about 0.5 µm and about 3.0 µm. The insulating sub-layers may be formed of, for example, silicon oxide, borophosphosilicate glass, undoped silicate glass, fluorinated silicate glass, low-k dielectric materials, the like, or a combination thereof. The insulating sub-layers may be formed of different materials but are not limited thereto.

The insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the conductive features of the bottom die 310 may be formed in the dielectric layer 313. The conductive features may include conductive lines (not shown), conductive vias (not shown), and the first connecting pads 317 and the second connecting pads 319. The conductive lines may be separated from each other and may be horizontally disposed in the dielectric layer 313 along the direction Z. In the present embodiment, the topmost conductive lines may be designated as the first connecting pads 317 and the second connecting pads 319. The top surfaces of the first connecting pads 317, the top surfaces of the second connecting pads 319, and the top surface of the dielectric layer 313 may be substantially coplanar. The conductive vias may connect adjacent conductive lines along the direction Z, adjacent device element and conductive line, adjacent first connecting pad 317 and conductive line, and adjacent second connecting pad 319 and conductive line.

In some embodiments, within a given area, the number of the first connecting pads 317 may be less than a number of the second connecting pads 319. In other words, the pad density of the first connecting pads 317 may be less than the pad density of the second connecting pads 319.

In some embodiments, the conductive features of the bottom die 310 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The conductive features may be formed during the formation of the dielectric layer 313.

In some embodiments, the device elements and the conductive features of the bottom die 310 may together configure functional units of the first controller die 110. In some embodiments, the functional units of the bottom die 310 may include, for example, highly complex circuits such as processor cores, memory controllers, or accelerator units. In some embodiments, the functional units of the bottom die 310 may include control circuit and high-speed circuitry. In some embodiments, the bottom die 310 may be configured as a logic die.

Figure 21:
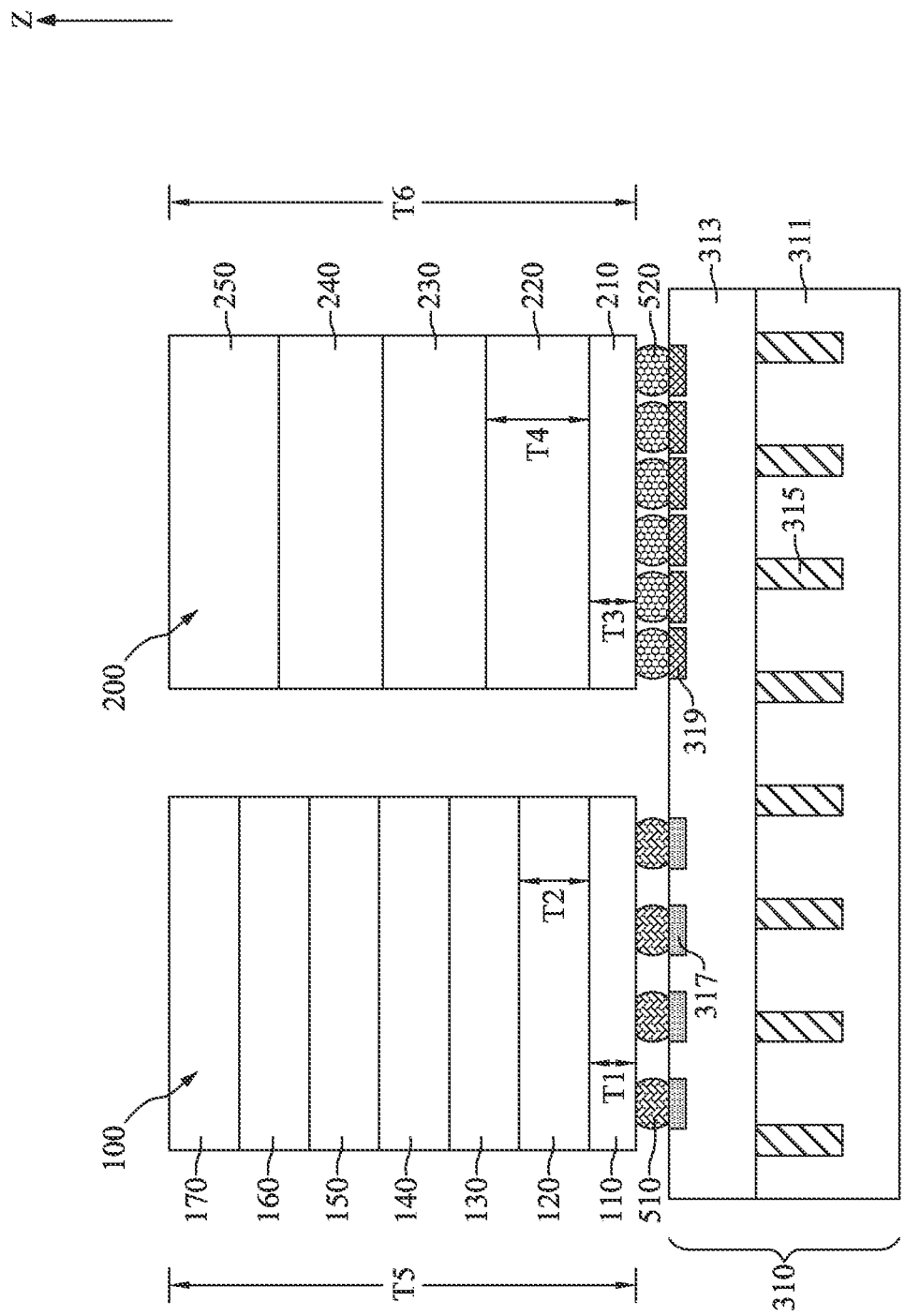

With reference to FIG. 21, the first stacking structure 100 may be formed on the bottom die 310 through the first interconnect units 510. The first interconnect units 510 may be formed on the first connecting pads 317 and electrically connected to the first connecting pads 317. In some embodiments, the bonding between the first stacking structure 100 and the bottom die 310 may use a thermal compression process and/or a reflow process.

With reference to FIG. 21, the second stacking structure 200 may be formed on the bottom die 310 through the second interconnect units 520. The second interconnect units 520 may be formed on the second connecting pads 319 and electrically connected to the second connecting pads 319. In some embodiments, the bonding between the second stacking structure 200 and the bottom die 310 may use a thermal compression process and/or a reflow process.

In some embodiments, the number of the second interconnect units 520 may be greater than the number of the first interconnect units 510. In some embodiments, the thickness T1 of the first controller die 110 and the thickness T3 of the second controller die 210 may be substantially the same. In some embodiments, the thickness T5 of the first stacking structure 100 and the thickness T6 of the second stacking structure 200 may be substantially the same. In some embodiments, the thickness T3 of the first storage die 120 may be less than the thickness T4 of the second storage die 220. In some embodiments, the number of the first storage dies 120, 130, 140, 150, 160, 170 may be greater than the number of the second storage dies 220, 230, 240, and 250.

Figure 22:
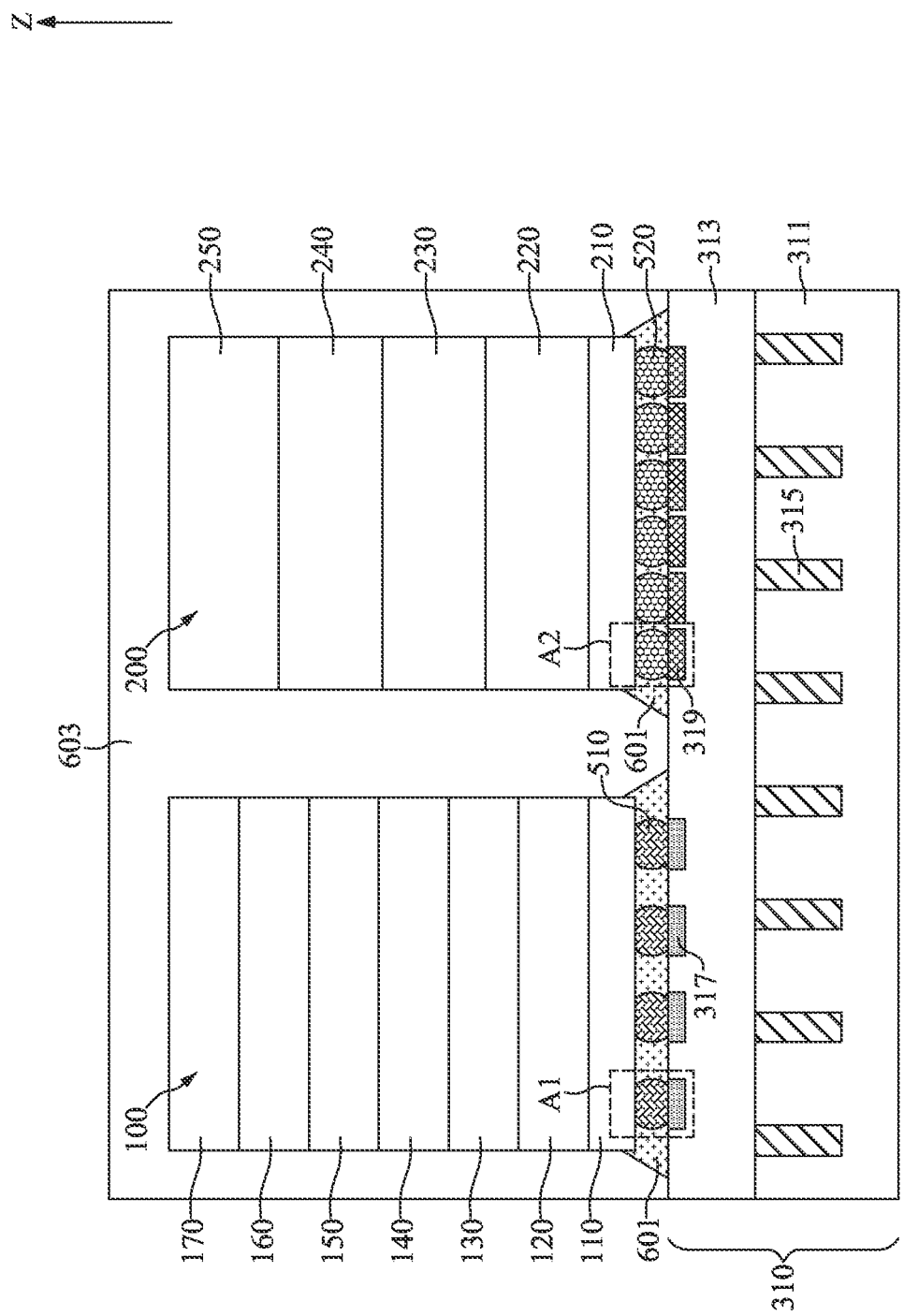
Figure 23:
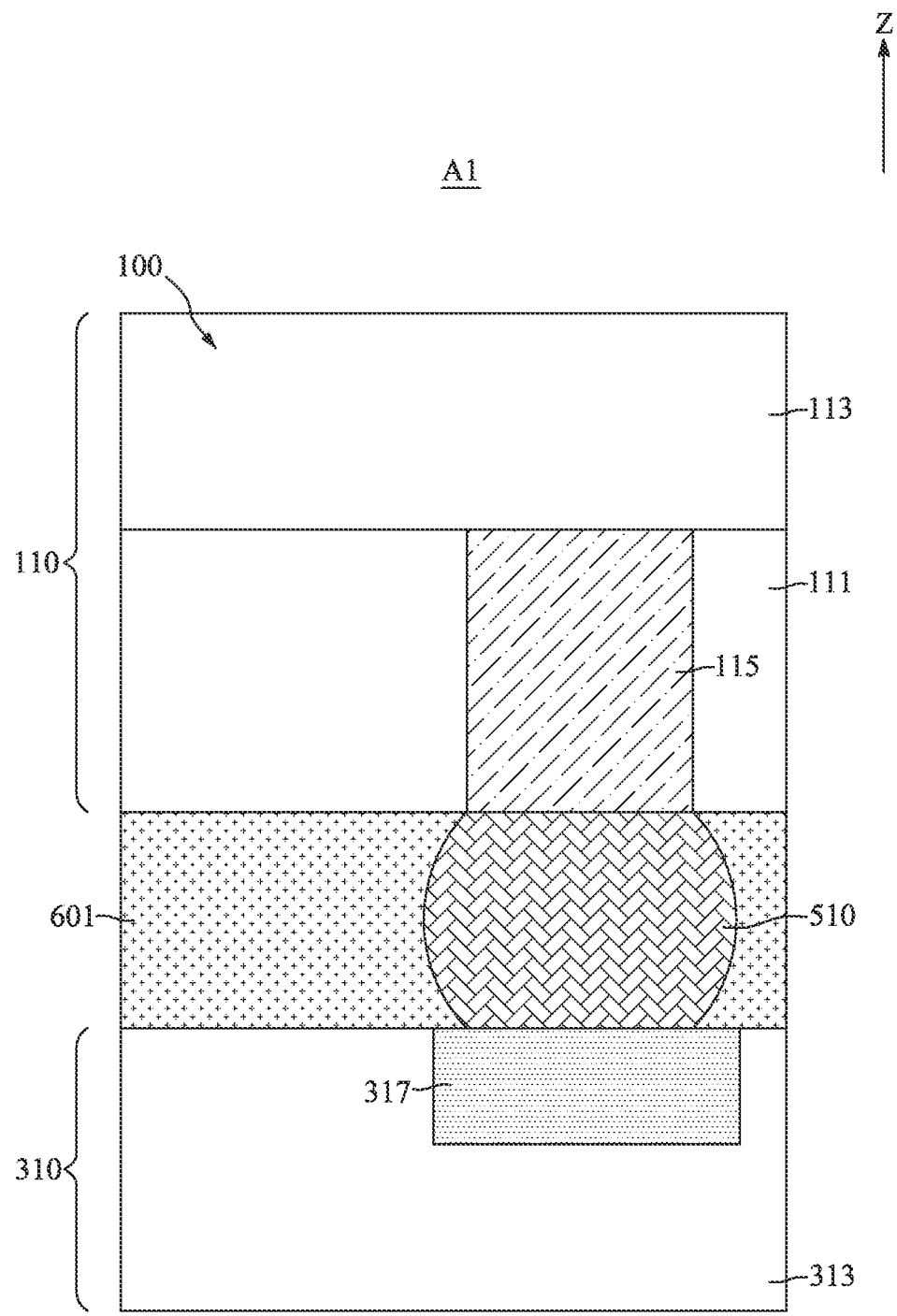
FIGS. 23 and 24 are close-up schematic cross-sectional view diagrams of areas A1 and A2 in FIG. 22.
Figure 24:
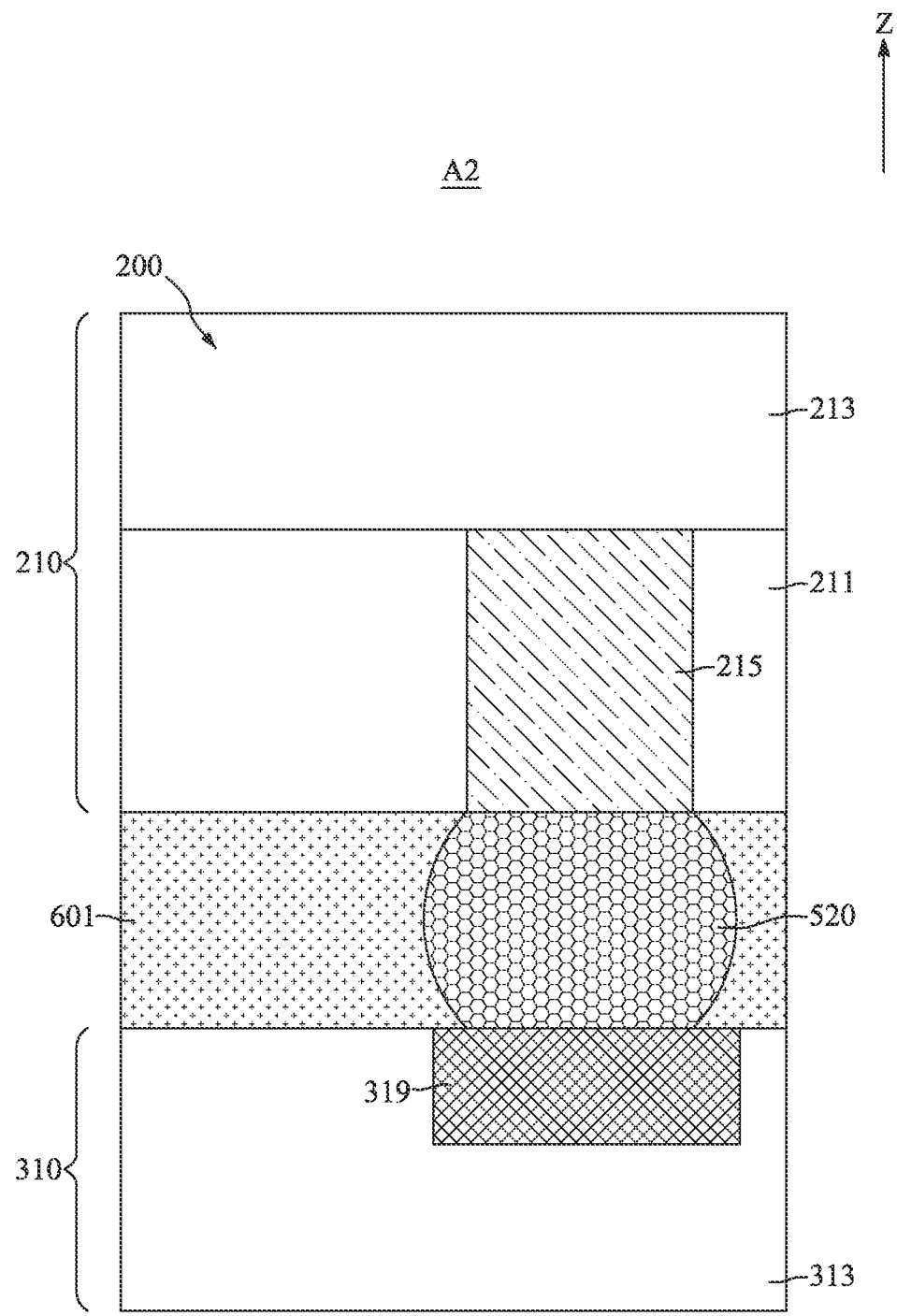

With reference to FIGS. 22 to 24, underfill layers 601 may be filled between the first stacking structure 100 and the bottom die 310, and between the second stacking structure 200 and the bottom die 310. The underfill layers 601 may surround the first interconnect units 510 and the second interconnect units 520. In some embodiments, the underfill layers 601 may also seal a portion of the lateral surfaces (e.g., side surfaces) of the first stacking structure 100 and the second stacking structure 200.

In some embodiments, the underfill layers 601 may be formed by curing an underfill material which is made up of a cross-linked organic resin and low Coefficient of Thermal Expansion (CTE) inorganic particles (up to 75 wt. %). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The underfill layers 601 may tightly adhere to the first stacking structure 100, the second stacking structure 200, and the bottom die 310 so as to the underfill layers 601 may redistribute the stresses and strains from the CTE mismatch and mechanical shock over the first stacking structure 100 and the second stacking structure 200. As a result, crack initiation and growth in the first interconnect units 510 and the second interconnect units 520 may be either prevented or drastically reduced. In addition, the underfill layers 601 may provide protection to the first interconnect units 510 and the second interconnect units 520 to improve mechanical integrity of the configuration of the bottom die 310 and the first stacking structure 100 and the second stacking structure 200. Furthermore, the underfill layers 601 may provide partial protection against moisture ingress, and other forms of contamination.

With reference to FIGS. 22 to 24, the molding layer 603 may be formed to cover the first stacking structure 100 and the second stacking structure 200. The molding layer 603 may be formed of a molding compound such as polybenzoxazole, polyimide, benzocyclobutene, epoxy laminate, or ammonium bifluoride. The molding layer 603 may be formed by compressive molding, transfer molding, liquid encapsulent molding, and the like. For example, a molding compound may be dispensed in liquid form. Subsequently, a curing process is performed to solidify the molding compound. The formation of molding compound may overflow the first stacking structure 100 and the second stacking structure 200 so that molding compound covers the first stacking structure 100 and the second stacking structure 200.

With reference to FIG. 25, a planarization process, such as chemical mechanical polishing, may be performed until the first stacking structure 100 and the second stacking structure 200 are exposed. A heat sink layer (not shown) may be formed on the first stacking structure 100 and the second stacking structure 200 to improve the heat dissipation capability. In some embodiments, the planarization process may be optional.

With reference to FIGS. 1 and 26, at step S17, the bottom die 310 may be bonded on a base substrate 605.

With reference to FIG. 26, the base substrate 605 may be provided. The base substrate 605 may be a laminate sheet but is not limited thereto. In some embodiments, the base substrate 605 may include an epoxy based material or bismaleimide triazine. In some embodiments, the base substrate 605 may be a printed circuit board. The bottom die 310 and the base substrate 605 may be bonded through a plurality of third interconnect units 530. The third interconnect units 530 may be formed between the bottom die 310 and the base substrate 605. The third interconnect units 530 may be electrically connected to the through substrate vias 315, respectively and correspondingly. In some embodiments, the third interconnect units 530 may be solder balls, and may be formed between the bottom die 310 and the base substrate 605 by using a thermal compression process and/or a reflow process.

Figure 27:
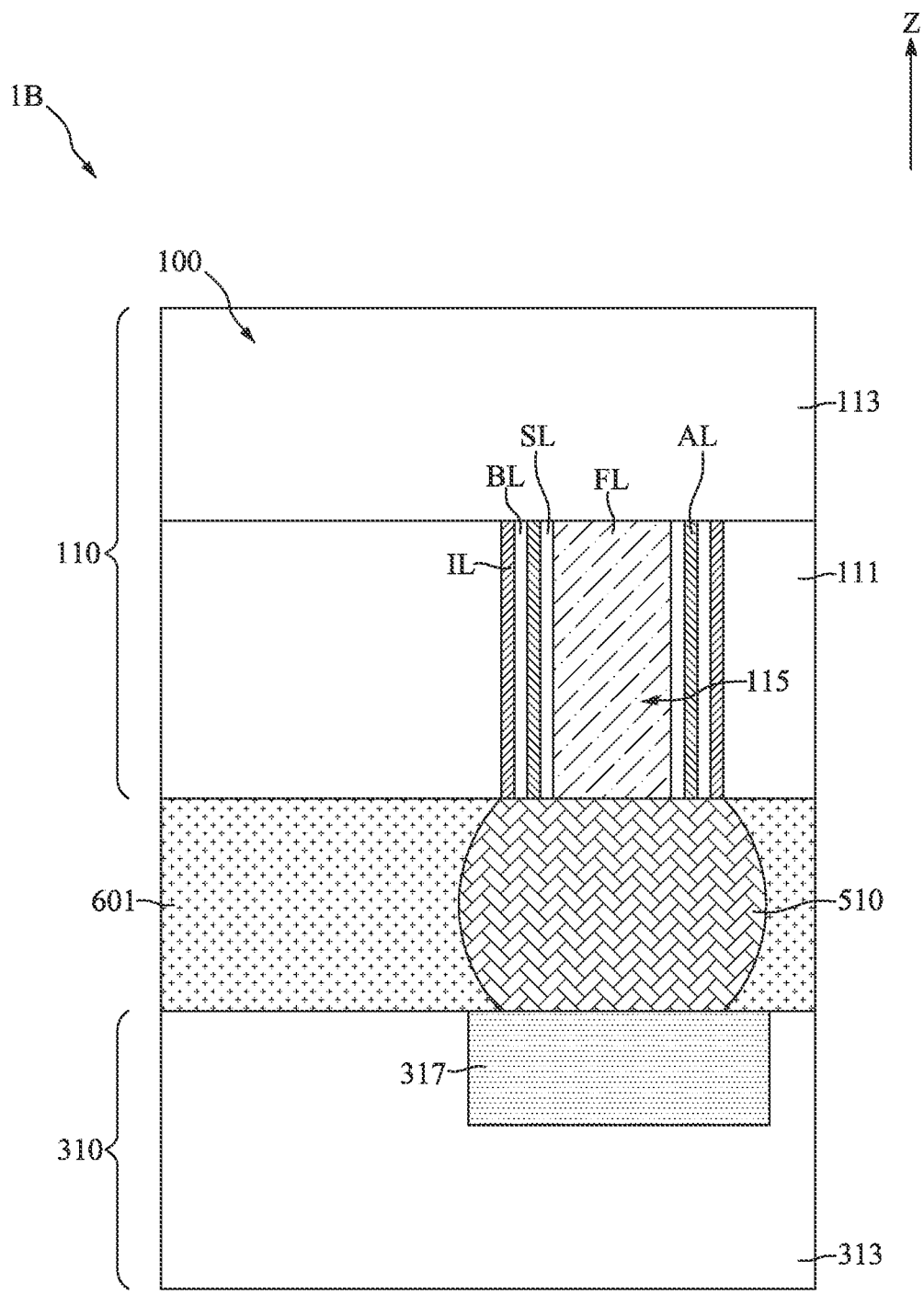
FIG. 27 illustrates, in a close-up schematic cross-sectional view diagram, a semiconductor device in accordance with another embodiment of the present disclosure.

FIG. 27 illustrates, in a close-up schematic cross-sectional view diagram, a semiconductor device 1B in accordance with another embodiment of the present disclosure.

In the semiconductor device 1B, the through substrate via 115 may include a filler layer FL, a seed layer SL, an adhesion layer AL, a barrier layer BL, and an isolation layer IL.

In some embodiments, the filler layer FL may be disposed along the substrate 111 of the 110 first controller die 110 and electrically connected to the corresponding first interconnect unit 510. The filler layer FL may be formed of, for example, doped polysilicon, tungsten, copper, carbon nanotube, or solder alloy.

In some embodiments, the isolation layer IL may be formed between the filler layer FL and the substrate 111. In some embodiments, the isolation layer IL may be formed of for example, silicon oxide, silicon nitride, silicon oxynitride, or tetra-ethyl ortho-silicate. The isolation layer IL may have a thickness between about 50 nm and about 200 nm. In some embodiments, the isolation layer IL may be formed of, for example, parylene, epoxy, or poly(p-xylene). The isolation layer IL may have a thickness between about 1 µm and about 5 µm. The isolation layer IL may ensure the filler layer FL is electrically isolated in the substrate 111.

In some embodiments, the seed layer SL may be formed between the filler layer FL and the isolation layer IL. In some embodiments, the seed layer SL may have a thickness between about 10 nm and about 40 nm. In some embodiments, the seed layer SL may include, for example, at least one selected from the group consisting of aluminum, gold, beryllium, bismuth, cobalt, copper, hafnium, indium, manganese, molybdenum, nickel, lead, palladium, platinum, rhodium, rhenium, lutetium, tantalum, tellurium, titanium, tungsten, zinc, and zirconium. The seed layer SL may reduce a resistivity of an opening during the formation of the filler layer FL.

In some embodiments, the adhesion layer AL may be formed between the seed layer SL and isolation layer IL. The seed layer SL may be formed of, for example, titanium, tantalum, titanium tungsten, or manganese nitride. The seed layer SL may improve an adhesion between the seed layer SL and the barrier layer BL.

In some embodiments, the barrier layer BL may be between the adhesion layer AL and the isolation layer IL. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the substrate 111.

In some embodiments, other through substrate vias or through die vias may have structures similar to the through substrate via 115, and descriptions thereof are not repeated herein.

Figure 28:
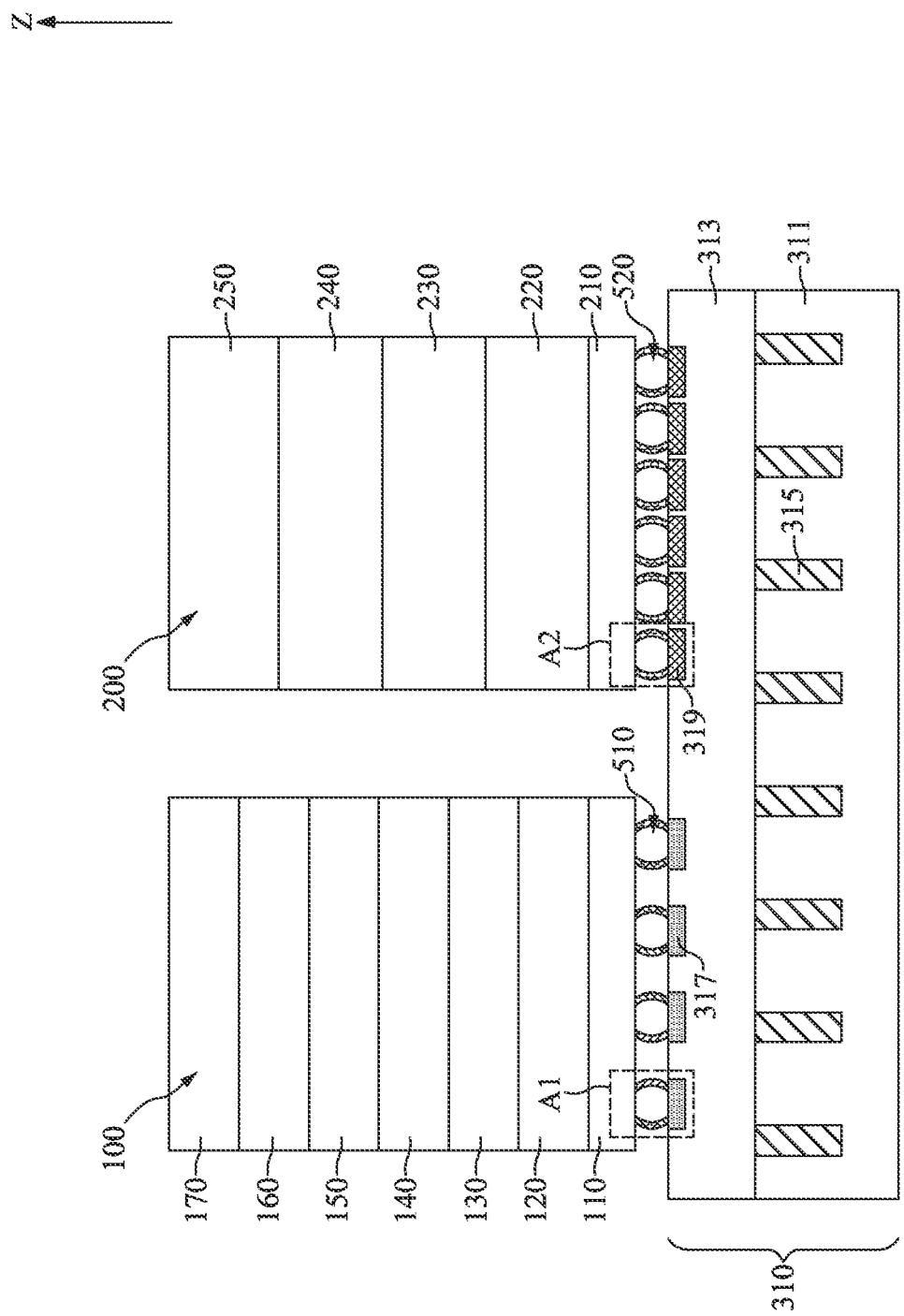
FIG. 28 illustrates, in a schematic cross-sectional view diagram, part of a flow for fabricating a semiconductor device in accordance with another embodiment of the present disclosure.
Figure 29:
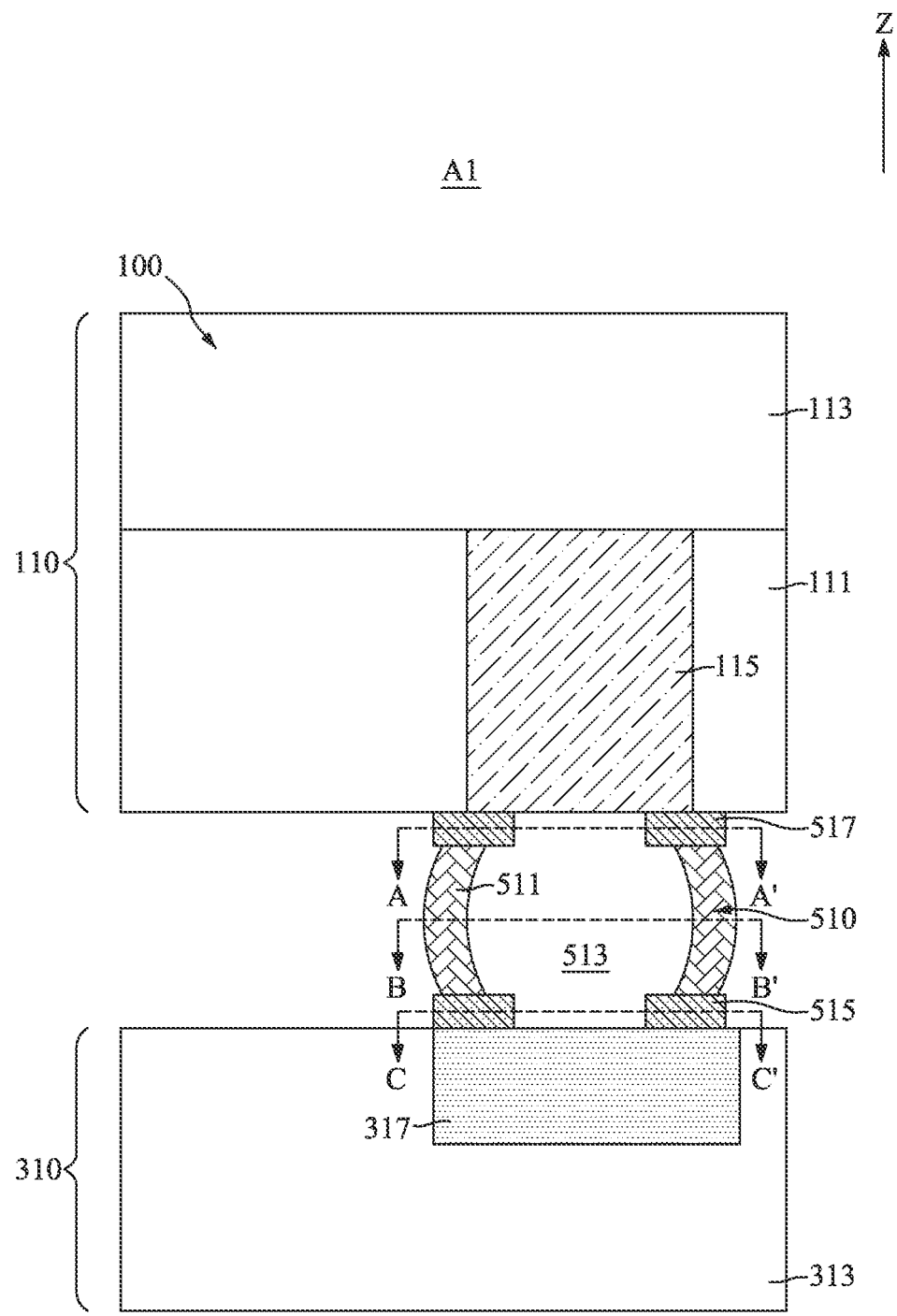
FIG. 29 is a close-up schematic cross-sectional view diagram of an area A1 in FIG. 28.
Figure 30:
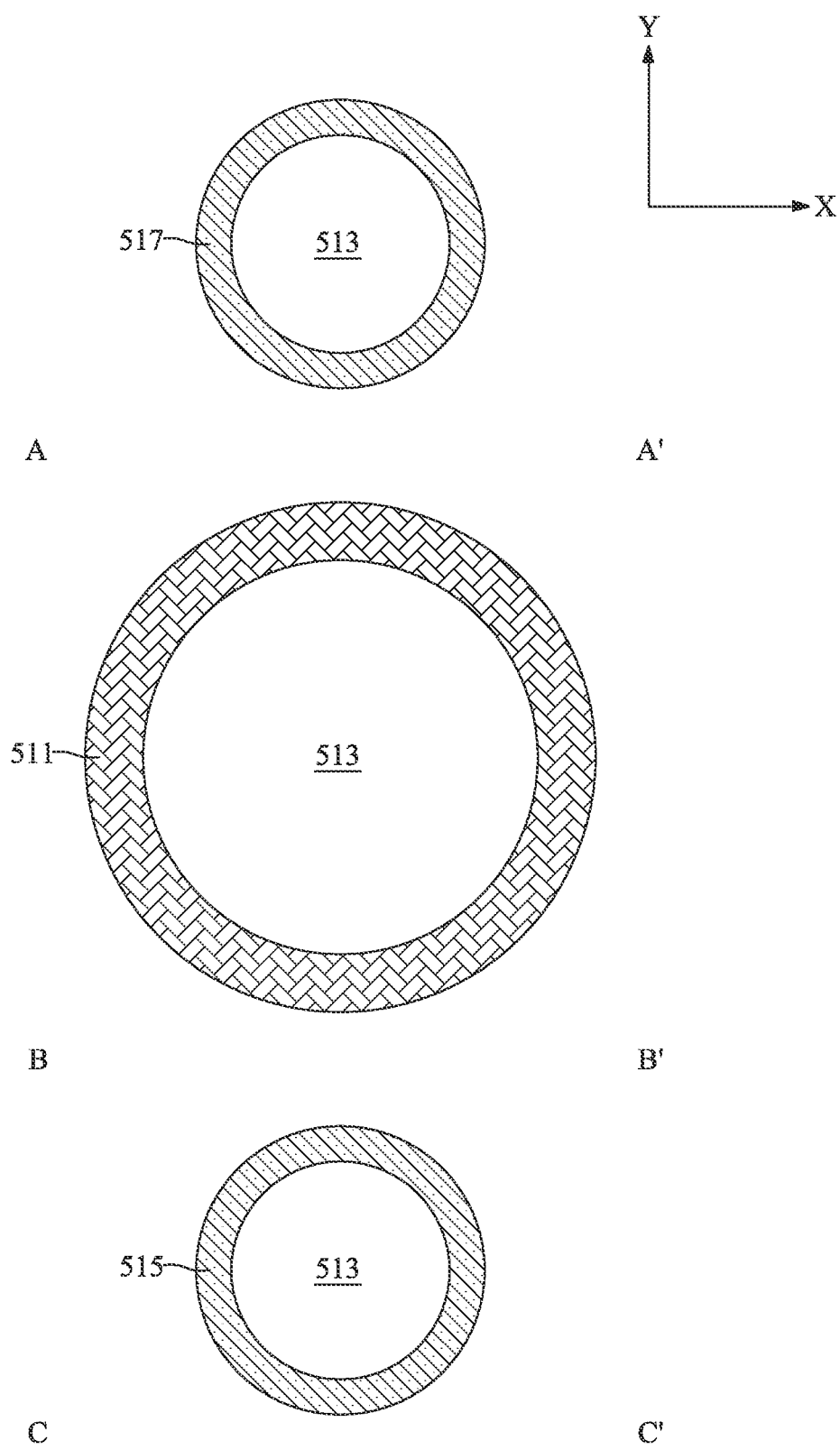
FIG. 30 is a schematic cross-sectional view diagram taken along lines A-A', B-B', and C-C' in FIG. 29.
Figure 31:
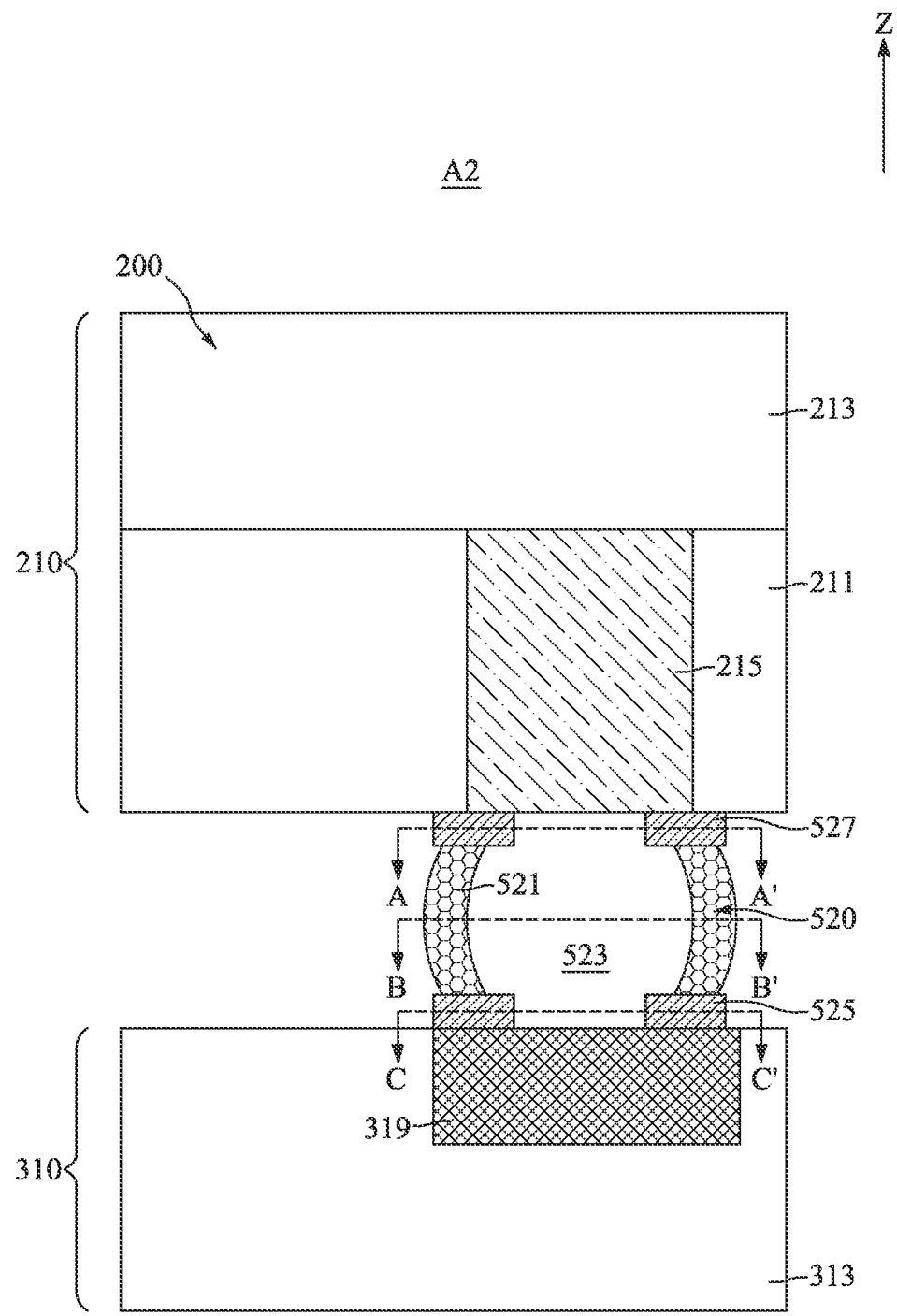
FIG. 31 is a close-up schematic cross-sectional view diagram of an area A2 in FIG. 28.
Figure 32:
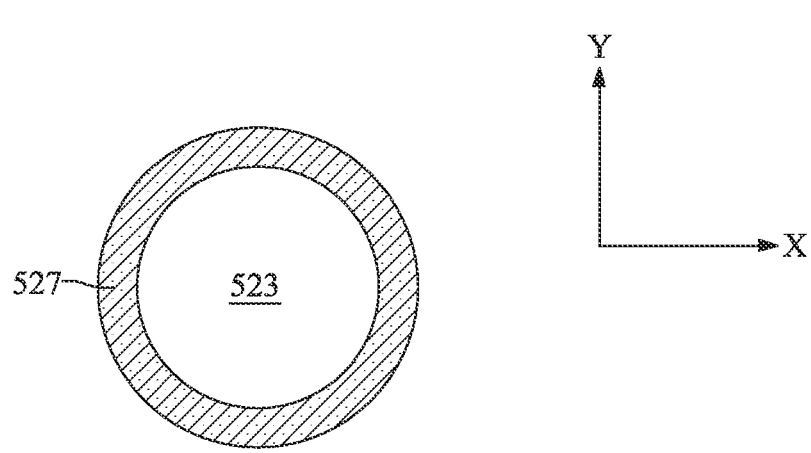
FIG. 32 is a schematic cross-sectional view diagram taken along lines A-A', B-B', and C-C' in FIG. 30.
Figure 32:
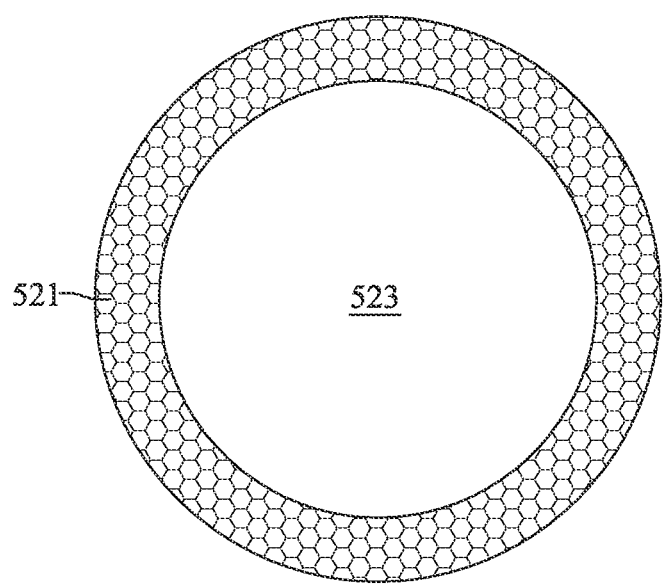
Figure 32:
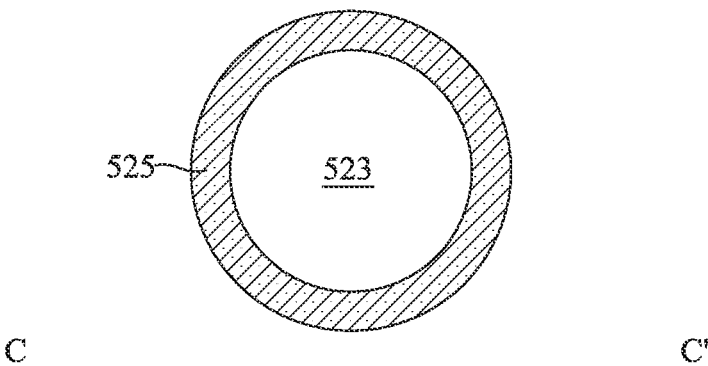

FIG. 28 illustrates, in a schematic cross-sectional view diagram, part of a flow for fabricating a semiconductor device 1C in accordance with another embodiment of the present disclosure. FIG. 29 is a close-up schematic cross-sectional view diagram of an area A1 in FIG. 28. FIG. 30 is a schematic cross-sectional view diagram taken along lines A-A', B-B', and C-C' in FIG. 29. FIG. 31 is a close-up schematic cross-sectional view diagram of an area A2 in FIG. 28. FIG. 32 is a schematic cross-sectional view diagram taken along lines A-A', B-B', and C-C' in FIG. 30.

With reference to FIG. 28, an intermediate semiconductor device may be fabricated with a procedure similar to that illustrated in FIGS. 2 to 21, and descriptions thereof are not repeated herein. For brevity, clarity, and convenience of description, only one first interconnect unit 510 and one second interconnect unit 520 are described.

With reference to FIGS. 28 to 31, in some embodiments, a first bottom annular layer 515 may be formed on the first connecting pad 317. A first top annular layer 517 may be formed under the through substrate via 115. In some embodiments, the first bottom annular layer 515 and the first top annular layer 517 may be formed of, for example, copper or other suitable metal or metal alloy.

The first interconnect unit 510 may include a first exterior layer 511 and a first cavity 513. The first exterior layer 511 may be formed between the first bottom annular layer 515 and the first top annular layer 517. The first exterior layer 511, the first bottom annular layer 515, and the first top annular layer 517 may have ring-shaped cross-sectional profiles, respectively and correspondingly. The space enclosed by the through substrate via 115, the first top annular layer 517, the first exterior layer 511, the first bottom annular layer 515, and the first connecting pad 317 may be referred to as the first cavity 513.

In some embodiments, through the use of the first bottom annular layer 515 on the first connecting pad 317, a first "seeding" point is created for the accumulation of vaporized flux at the non-conducting/non-wetting center of the annulus. As the vapor expands during solder heating and liquefication, a first interior cavity (not shown) is formed that is contained by the surface tension and viscosity of the molten solder. By including a second seeding point in the first top annular layer 517 under the through substrate via 115, a second interior cavity (not shown) is started that joins with the first interior cavity to produce the resulting first cavity 513. The surface tension properties force the formation of an exterior convex shape on the liquefied structure, that when cooled, solidifies in the barrel-shaped form of first exterior layer 511, since the outer shell solidifies before the vaporized fluxing agent in the interior contracts.

In some embodiments, the first interconnect unit 510 may be a solder ball. A relative volume of the first cavity 513 may range from 1% to 90% of the total volume of the first interconnect unit 510. The volume of the first cavity 513 may be controlled by controlling the temperature and time during heating of the solder. The composition of the solder should balance the properties of the solder and solder-alloys with the properties of a fluxing vapor. An exemplary solder compound can consist of portions any of the general soldering materials, such as solder, silver, and tin, and a fluxing agent, such as one or more from the group of rosin, resin, activator, thixotropic agent, and a high temperature boiling solvent.

With reference to FIGS. 28, 31, and 32, in some embodiments, a second bottom annular layer 525 may be formed on the second connecting pads 319. A second top annular layer 527 may be formed under the through substrate via 215. In some embodiments, the second bottom annular layer 525 and the second top annular layer 527 may be formed of, for example, copper or other suitable metal or metal alloy.

The second interconnect unit 520 may include a second exterior layer 521 and a second cavity 523. The second exterior layer 521 may be formed between the second bottom annular layer 525 and the second top annular layer 527. The second exterior layer 521, the second bottom annular layer 525, and the second top annular layer 527 may have ring-shaped cross-sectional profiles, respectively and correspondingly. The space enclosed by the through substrate via 215, the second top annular layer 527, the second exterior layer 521, the second bottom annular layer 525, and the second connecting pad 319 may be referred to as the second cavity 523.

In some embodiments, through the use of the second bottom annular layer 525 on the second connecting pad 319, a first "seeding" point is created for the accumulation of vaporized flux at the non-conducting/non-wetting center of the annulus. As the vapor expands during solder heating and liquefication, a first interior cavity (not shown) is formed that is contained by the surface tension and viscosity of the molten solder. By including a second seeding point in the second top annular layer 527 under the through substrate via 215, a second interior cavity (not shown) is started that joins with the first interior cavity to produce the resulting second cavity 523. The surface tension properties force the formation of an exterior convex shape on the liquefied structure, that when cooled, solidifies in the barrel-shaped form of second exterior layer 521, since the outer shell solidifies before the vaporized fluxing agent in the interior contracts.

In some embodiments, the second interconnect unit 520 may be a solder ball. A relative volume of the second cavity 523 may range from 1% to 90% of the total volume of the first interconnect unit 510. The volume of the second cavity 523 may be controlled by controlling the temperature and time during heating of the solder. The composition of the solder should balance the properties of the solder and solder-alloys with the properties of a fluxing vapor. An exemplary solder compound can consist of portions any of the general soldering materials, such as solder, silver, and tin, and a fluxing agent, such as one or more from the group of rosin, resin, activator, thixotropic agent, and a high temperature boiling solvent.

Figure 33:
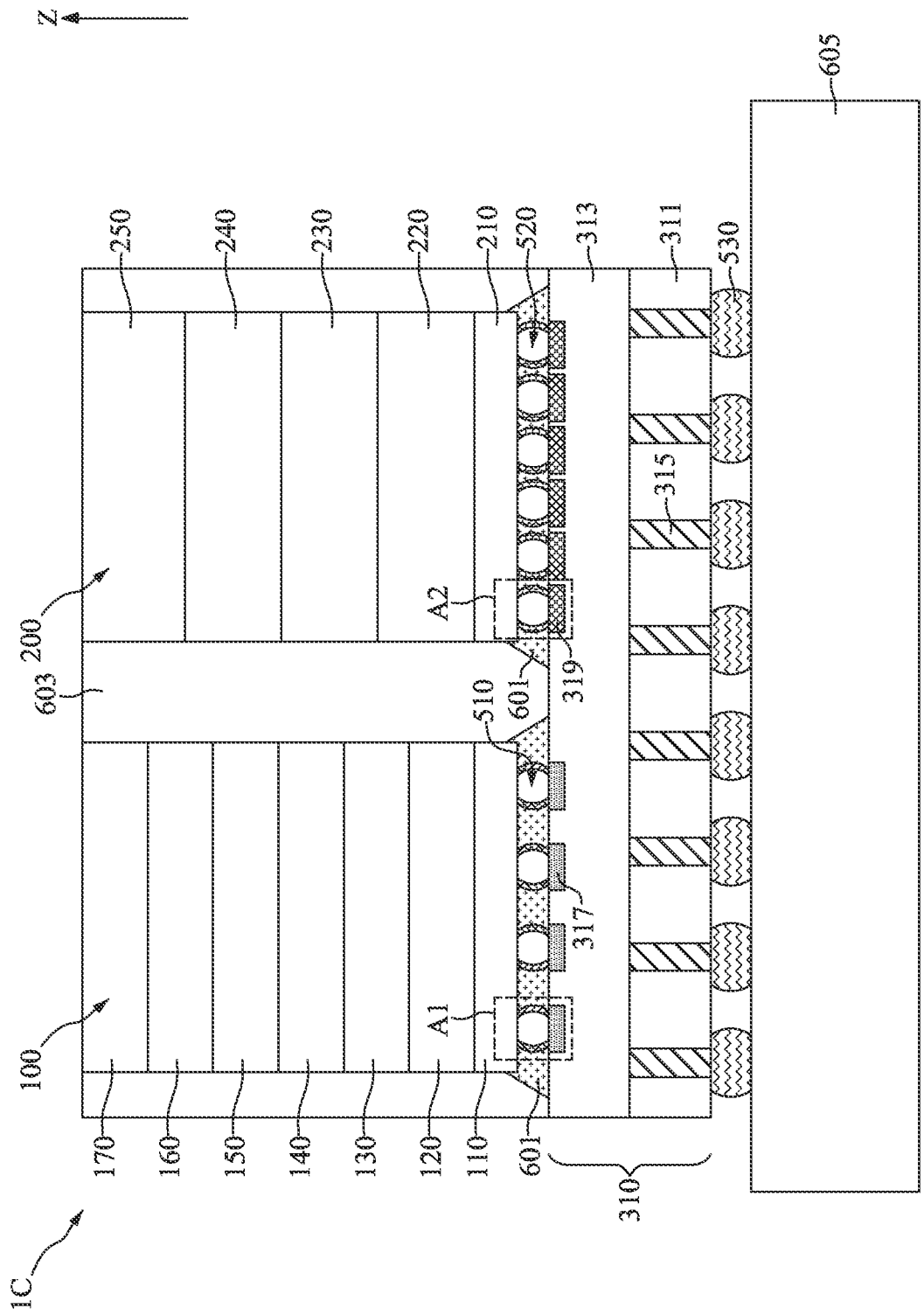
FIG. 33 illustrates, in a schematic cross-sectional view diagram, part of the flow for fabricating the semiconductor device in accordance with another embodiment of the present disclosure.
Figure 34:
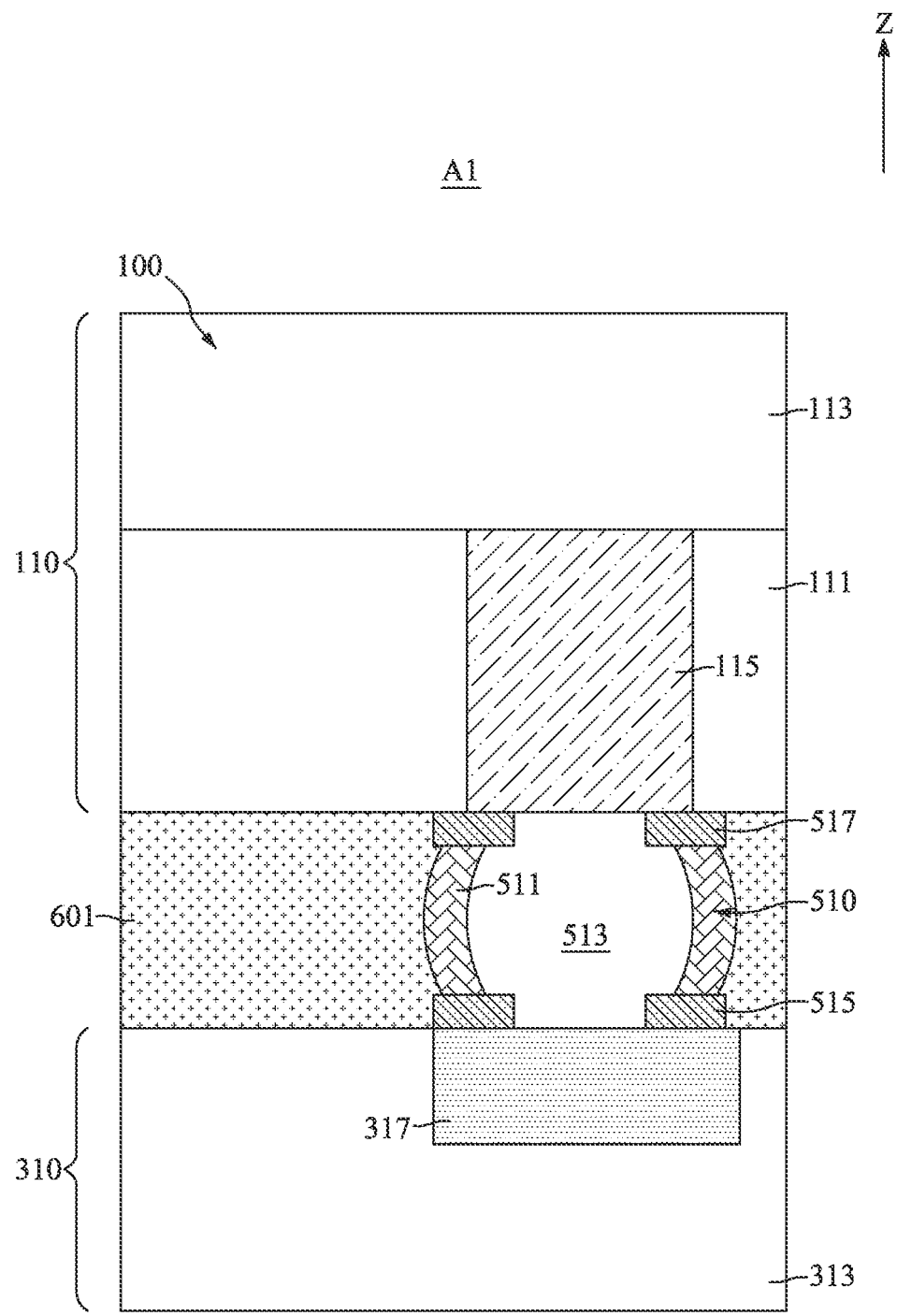
FIGS. 34 and 35 are close-up schematic cross-sectional view diagrams of areas A1 and A2 in FIG. 33.
Figure 35:
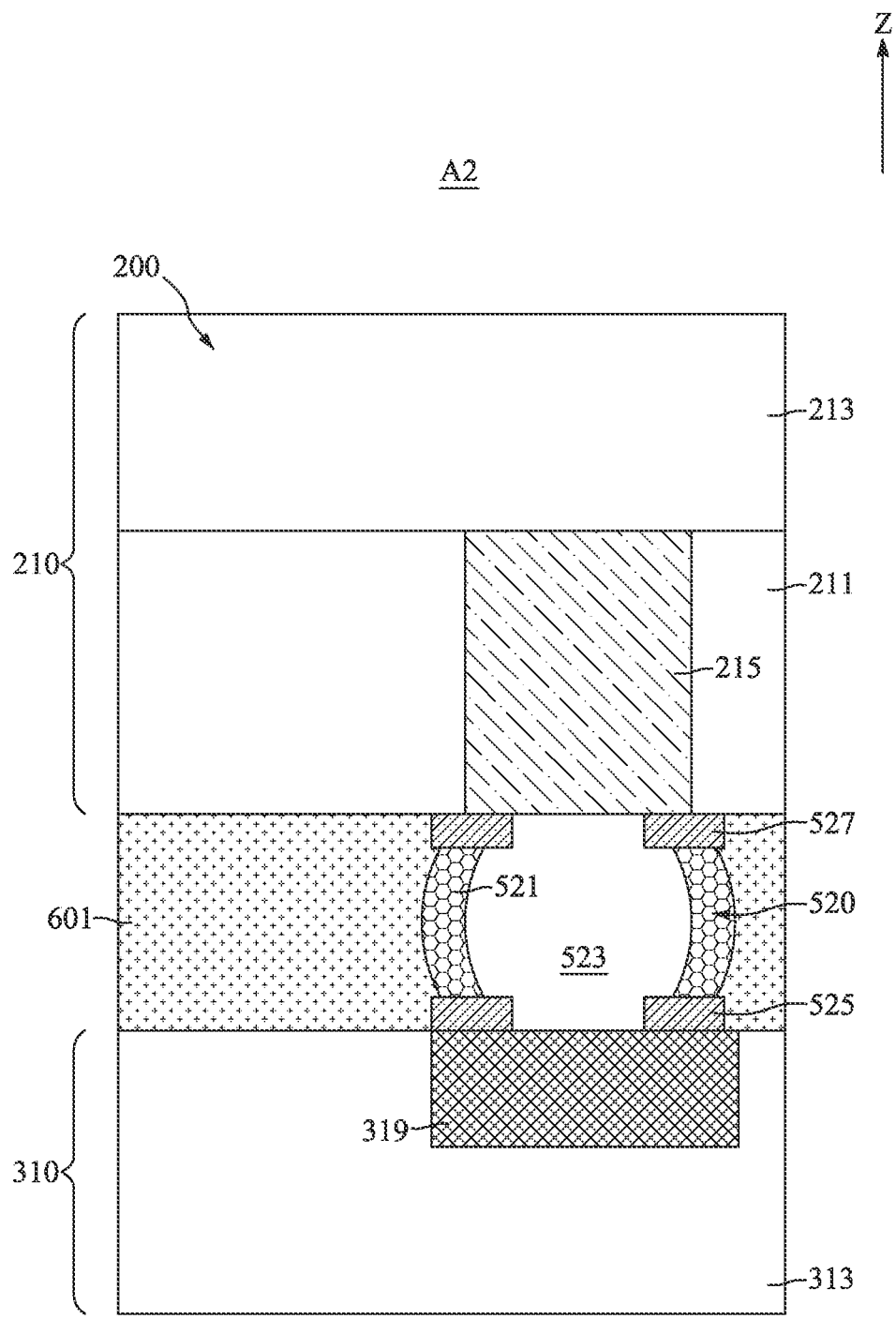

FIG. 33 illustrates, in a schematic cross-sectional view diagram, part of the flow for fabricating the semiconductor device 1C in accordance with another embodiment of the present disclosure. FIGS. 34 and 35 are close-up schematic cross-sectional view diagrams of areas A1 and A2 in FIG. 33.

With reference to FIGS. 33 to 35, the underfill layers 601, the molding layer 603, the third interconnect units 530, and the base substrate 605 may be formed with a procedure similar to that illustrated in FIGS. 22 to 26, and descriptions thereof are not repeated herein.

Potential destructive stress forces during fabricating or operating the semiconductor device 1C may be neutralized and reduced or removed by the first interconnect unit 510 including the first cavity 513 and the second interconnect unit 520 including the second cavity 523. As a result, the yield and the reliability of the semiconductor device 1C may be improved.

One aspect of the present disclosure provides a semiconductor device including a bottom die; a first stacking structure comprising a first controller die positioned on the bottom die, and a plurality of first storage dies stacked on the first controller die; and a second stacking structure comprising a second controller die positioned on the bottom die, and a plurality of second storage dies stacked on the second controller die. The plurality of first storage dies respectively comprise a plurality of first storage units configured as a floating array. The plurality of second storage dies comprise a plurality of second storage units respectively comprising an insulator-conductor-insulator structure.

Another aspect of the present disclosure provides a semiconductor device including a bottom die; a first stacking structure positioned on the bottom die through a plurality of first interconnect units; and a second stacking structure positioned on the bottom die through a plurality of second interconnect units. The first stacking structure comprises a first controller die positioned on the plurality of first interconnect units, and a plurality of first storage dies stacked on the first controller die and configured as a floating array. The second stacking structure comprises a second controller die positioned on the plurality of second interconnect units, and a plurality of second storage dies stacked on the second controller die and respectively comprising an insulator-conductor-insulator structure.

Another aspect of the present disclosure provides a method for fabricating a semiconductor device including providing a first stacking structure comprising a first controller die, and a plurality of first storage dies sequentially stacked on the first controller die; providing a second stacking structure comprising a second controller die, and a plurality of second storage dies sequentially stacked on the second controller die; bonding the first controller die onto a bottom die through a plurality of first interconnect units; and bonding the second controller die onto the bottom die through a plurality of second interconnect units. The plurality of first storage dies respectively comprise a plurality of first storage units configured as a floating array. The plurality of second storage dies comprise a plurality of second storage units respectively comprising an insulator-conductor-insulator structure.

Due to the design of the semiconductor device of the present disclosure, the first stacking structure 100 including the first storage units 129 in the form of floating array and the second stacking structure 200 including the second storage units 229 including the insulator-conductor-insulator structures may be integrated with the bottom die 310. Hence, the dimension of the semiconductor device 1A may be reduced. In addition, the through substrate vias may also reduce electrical paths within the first stacking structure 100 and/or the second stacking structure 200 so that the power consumption may be reduced. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a first stacking structure comprising:
      a first controller die; and
      a plurality of first storage dies sequentially stacked on the first controller die;
   providing a second stacking structure comprising:
      a second controller die; and
      a plurality of second storage dies sequentially stacked on the second controller die;
   bonding the first controller die onto a bottom die through a plurality of first interconnect units, wherein the plurality of first interconnect units respectively comprise a first exterior layer and a first cavity, the first exterior layer is between the first stacking structure and the bottom die, and the first cavity is enclosed by and directly contacted with the first exterior layer, the first stacking structure, and the bottom die; and
   bonding the second controller die onto the bottom die through a plurality of second interconnect units;
   wherein the plurality of first storage dies respectively comprise a plurality of first storage units configured as a floating array;
   wherein the plurality of second storage dies comprise a plurality of second storage units respectively comprising an insulator-conductor-insulator structure.

2. The method of claim 1, further comprising forming an underfill layer between the first controller die and the bottom die, and surrounding the plurality of first interconnect units.

3. The method of claim 2, further comprising bonding the bottom die onto a base substrate through a plurality of third interconnect units.

4. The method of claim 3, wherein a bottommost one of the plurality of first storage dies is stacked on the first controller die in a face-to-face configuration.

5. A method for fabricating a semiconductor device, comprising:
   providing a bottom die;
   forming a first stacking structure on the bottom die through a plurality of first interconnect units, wherein the plurality of first interconnect units respectively comprise a first exterior layer and a first cavity, the first exterior layer is between the first stacking structure and the bottom die, and the first cavity is enclosed by and directly contacted with the first exterior layer, the first stacking structure, and the bottom die; and
   forming a second stacking structure on the bottom die through a plurality of second interconnect units;
   wherein the first stacking structure comprises:
   a first controller die on the plurality of first interconnect units; and
   a plurality of first storage dies stacked on the first controller die and configured as a floating array;
   wherein the second stacking structure comprises:
   a second controller die on the plurality of second interconnect units; and
   a plurality of second storage dies stacked on the second controller die and respectively comprising an insulator-conductor-insulator structure.

6. The method of claim 5, further comprising: forming a first bottom annular layer and a first top annular layer;
   wherein the first bottom annular layer is between the first exterior layer and the bottom die, and the first top annular layer is between the first exterior layer and the first stacking structure;

wherein the first cavity is enclosed by the first exterior layer, the first top annular layer, the first bottom annular layer, the first stacking structure, and the bottom die.

7. The method of claim 6, wherein a thickness of the first controller die and a thickness of the second controller die are substantially the same.

8. The method of claim 7, wherein a thickness of the first stacking structure and a thickness of the second stacking structure are substantially the same.

9. The method of claim 8, wherein a number of the plurality of first storage dies is greater than a number of the plurality of second storage dies.

10. The method of claim 9, further comprising: forming a first through die via along one of the plurality of first storage dies, on the first controller die, and electrically connected to the first controller die.

11. The method of claim 10, further comprising: forming a second through die via along at least two of the plurality of first storage dies, on the first controller die, and electrically connected to the first controller die.

12. The method of claim 11, wherein a width of the second through die via is greater than a width of the first through die via.

13. The method of claim 12, wherein a number of the plurality of first interconnect units is less than a number of the plurality of second interconnect units.

14. The method of claim 13, further comprising: forming an underfill layer between the first controller die and the bottom die, and surrounding the plurality of first interconnect units.

* * * * *